(12) United States Patent
Lahav et al.

(10) Patent No.: US 9,865,632 B2
(45) Date of Patent: Jan. 9, 2018

(54) IMAGE SENSOR PIXEL WITH MEMORY NODE HAVING BURIED CHANNEL AND DIODE PORTIONS FORMED ON N-TYPE SUBSTRATE

(71) Applicant: Tower Semiconductor Ltd., Migdal Haemek (IL)

(72) Inventors: Assaf Lahav, Binyamina (IL); Amos Fenigstein, Haifa (IL); Yakov Roizin, Afula (IL); Avi Strum, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 15/658,328

(22) Filed: Jul. 24, 2017

(65) Prior Publication Data

US 2017/0323912 A1 Nov. 9, 2017

Related U.S. Application Data

(63) Continuation-in-part of application No. 14/665,803, filed on Mar. 23, 2015, now Pat. No. 9,729,810.

(51) Int. Cl.
*H04N 5/335* (2011.01)
*H01L 27/146* (2006.01)
(Continued)

(52) U.S. Cl.
CPC .... *H01L 27/1461* (2013.01); *H01L 27/14623* (2013.01); *H01L 27/14643* (2013.01); *H04N 5/3532* (2013.01); *H04N 5/3745* (2013.01)

(58) Field of Classification Search
CPC ........................ H01L 27/1461; H04N 5/37452
See application file for complete search history.

(56) References Cited

U.S. PATENT DOCUMENTS 7,361,877 B2  4/2008  McGrath et al.
7,749,874 B2  7/2010  Drowley et al.
(Continued)

OTHER PUBLICATIONS

Lahav, Assaf et al.; "Optimization of Random Telegraph Noise Non Uniformity in a CMOS Pixel with a pinned-photodiode", Tower Semiconductor Ltd., 4 pages, (date unknown).
(Continued)

*Primary Examiner* — Gary C Vieaux
(74) *Attorney, Agent, or Firm* — Bever, Hoffman & Harms, LLP

(57) ABSTRACT

A global shutter image sensor formed on an n-type bulk substrate and including pixels having pinned n-type photodiodes and memory nodes formed in designated n-doped epitaxial layer regions that are separated from the bulk substrate by a p-type vertical (potential) barrier implant. Each memory node includes both a buried channel portion and a contiguous pinned diode portion having different doping levels such that an intrinsic lateral electrical field drives electrons from the buried channel portion into the pinned diode portion during global charge transfer from an adjacent photodiode. The p-type vertical (potential) barrier implant is coupled to ground, and the bulk substrate is switched between a low integration voltage level during integration periods, and a high reset voltage level, whereby the photodiodes are globally reset without requiring reset transistors. P-type sinker implant sections and p-type vertical barrier implants form box-like diffusions around each pixel's photodiode and memory node.

19 Claims, 10 Drawing Sheets

(51) Int. Cl.
H04N 5/353 (2011.01)
H04N 5/3745 (2011.01)

(56) References Cited

U.S. PATENT DOCUMENTS

| | | | |
|---|---|---|---|
| 7,825,444 B2 | 11/2010 | Rhodes et al. | |
| 8,009,215 B2 | 8/2011 | Adkisson | |
| 8,089,036 B2 | 1/2012 | Manabe | |
| 8,138,531 B2 | 3/2012 | Adkisson et al. | |
| 2011/0187908 A1 | 8/2011 | Kawahito | |
| 2011/0241079 A1* | 10/2011 | Oike | H01L 27/14616 |
| | | | 257/225 |
| 2011/0260059 A1 | 10/2011 | Jiang | |
| 2012/0193692 A1 | 8/2012 | Kawahito | |

OTHER PUBLICATIONS

Lauxtermann, Stefan, et al.; "Comparison of Global Shutter Pixels for CMOS Image Sensors", Teledyne Imaging Sensors (Camarillo, CA), 4 pages (date unknown).

* cited by examiner

IMAGE SENSOR PIXEL WITH MEMORY NODE HAVING BURIED CHANNEL AND DIODE PORTIONS FORMED ON N-TYPE SUBSTRATE

RELATED APPLICATION

This application is a continuation-in-part (CIP) of U.S. Patent application for "Image Sensor Pixel With Memory Node Having Buried Channel And Diode Portions", U.S. application Ser. No. 14/665,803, filed Mar. 23, 2015.

FIELD OF THE INVENTION

This invention relates to solid state image sensors, and more specifically to solid state image sensors formed on n-type substrates and having an electronic Global Shutter (GS).

BACKGROUND OF THE INVENTION

Solid-state image sensors are used in, for example, video cameras, and are presently realized in a number of forms including charge coupled devices (CCDs) and CMOS image sensors. These image sensors are based on a two dimensional array of pixels. Each pixel includes a sensing element that is capable of converting a portion of an optical image into an electronic signal. These electronic signals are then used to regenerate the optical image on, for example, a liquid crystal display (LCD).

More recently, however, CMOS image sensors have gained in popularity. Pure CMOS image sensors have benefited from advances in CMOS technology for microprocessors and ASICs and provide several advantages over CCD imagers. Shrinking lithography, coupled with advanced signal-processing algorithms, sets the stage for sensor array, array control, and image processing on one chip produced using these well-established CMOS techniques. Shrinking lithography should also decrease imagearray cost due to smaller pixels. However, pixels cannot shrink too much, or they have an insufficient light-sensitive area. Nonetheless, shrinking lithography provides reduced metal-line widths that connect transistors and buses in the array.

CMOS image sensors utilize either a rolling shutter (RS) methodology or a global shutter (GS) methodology to capture image data (i.e., to expose the image sensor's pixel array to light from a subject image to be captured). The rolling shutter methodology captures the image on a rowby-row basis (i.e., the image portion applied on a given pixel row is converted to captured charges by the corresponding photodiodes, the captured charges are transferred to floating diffusion nodes and then read out by way of column lines, and then the process is repeated for the next sequential pixel row). In the resulting image data, the captured charges from each row represent the subject image at a different time, so the rolling shutter methodology is non-optimal for capturing highly dynamic events (e.g., high-speed objects). In contrast, the GS methodology involves causing every pixel in a pixel array to capture associated portions of a subject image at the same time, thereby facilitating the capture of highly dynamic events. The captured image is then read out of the pixels, typically in a row-by-row fashion using a rolling shutter (RS) readout operation.

An exemplary general GS pixel arrangement for a CMOS image sensor is disclosed in U.S. Pat. No. 8,138,531 to J. W. Adkisson (2012), and includes five transistors and a floating diffusion (FD) that stores the captured image (charge) information until it is read out during a RS readout operation. That is, the image information (captured charge) generated in the photodiode of each GS pixel is transferred to and temporarily stored in the FD of each GS pixel, and then the captured charges are systematically (e.g., row by row) read out of the FD of each pixel (e.g., one row of pixels at a time) during the RS operation.

The general 5T GS pixel approach and similar approaches encounter problems including signal noise and charge generation during readout. As mentioned above, captured light signals (electrons) are transferred to the FDs in all the pixels in the array at the same time, and then the captured signals stored in the FDs are read out row-by-row. The readout sequence performed on a selected row (which is sequentially repeated for all of the rows in the array) includes (a) reading the captured signals stored on all of the FDs in the selected row (i.e., by coupling the captured signals to a column line and reading the column line), (b) resetting the FDs in the selected row (i.e., evacuating electrons from the FDs until a Dark\Reset level is achieved), and then (c) reading the reset level stored on all of the FDs in the selected row (for comparison with the captured signal). Because the reset level is not the same level that was used to transfer the electrons, there is noise associated with it. The charge generation problem arises because the general GS pixel arrangement requires storage of the captured signals in the FDs of different rows for different amounts of time—i.e., when captured signals are sequentially read out starting with an uppermost row and ending with a lowermost row, the captured signals stored in the uppermost (i.e., first-read) row are stored for a shorter amount of time than the captured signals stored in the lower rows of the array, with the captured signals in the lowermost row being stored the longest amount of time. The lower rows, especially when not illuminated (i.e., when exposed to a relatively dark portion of a captured image), will suffer from parasitic charge generation due to a contact in the FD (storage) node which strongly increases generation, thereby corrupting the captured image. This charge generation problem is one of the main incentives for providing GS image sensors with the fastest possible readout process.

One approach used to reduce readout noise in GS image sensors includes providing each GS pixel with an additional storage node (referred to herein as a memory node (MN)), and reading out the captured charge using a correlated double sampling (CDS) readout operation. U.S. Pat. No. 7,361,877 to R. D. McGrath (2006) discloses an exemplary GS pixel utilizing a pinned photodiode, two storage nodes and two transfer gates, where the first transfer gate is used to transfer a captured charge from a pinned photodiode (first pinned diode) to a MN (second pinned diode), and the second transfer gate transfers the captured charge from the MN to a FD (sense node) during the RS operation. The CDS readout operation is perform by first resetting the FD and reading the reset level (typically referred to as a sampleand-hold reset (SHR) signal value), and then transferring the captured charge from the pixel's MN to the pixel's FD, and then reading the image bit level generated by the captured charge (typically referred to as a sample-and-hold image (SHS) signal value). The image bit level and the reset level are then correlated to provide the CDS readout value for that pixel. This CDS readout approach cancels out the kt/c associated with reset operations, which is otherwise dominant in low light.

In order to achieve optimal performance using the additional storage node approach, the MN must be optimized such that all the captured charge is transferred to the FD during CDS readout. That is, the two transfer gates and MN must be operably controlled to affect full charge transfer of the captured charge from the first pinned diode to the MN, and to affect the subsequent full charge transfer of the stored charge from the MN to the FD. In addition, the transfer gates must cooperate to effect good shutter performance of the MN (i.e., such that the MN exhibits low leakage, meaning low generation/recombination rates both in the dark and in the light).

The conventional additional storage node approach mentioned above fails to achieve optimal performance for several reasons. First, similar to the general 5T GS pixel approach (described above), captured charges are stored in the MN during the RS readout process (i.e., the captured charges are transferred to the FD only in the selected row), which subjects the captured charges to delay effects (generation) similar to those encountered in the general 5T GS pixel approach, although the applied parasitic generation current is arguably reduced over that encountered in the general 5T GS pixel approach by use of the pinned MN. Second, energy barriers for electrons prevent the full charge transfer from the pinned photodiode to the MN, and from the and MN to FD, which gives rise to image artifacts including image lag (i.e., when electrons that remain in the pinned diode or the MN are read at the next GS operation as an unwanted signal, and can be especially pronounced if the pixel collected photons from a bright source in the current GS operation). In order to operate correctly, there should be a built in potential difference between the pinned photodiode and the pinned memory node, but this potential difference is very difficult to achieve using the conventional power supply typically available in present-day CMOS process technologies (i.e., 0.18 micron process flows or smaller). For example, using a 0.18 micron CMOS process technology providing a 3.3V power supply, the inventors usually set the pinned photodiode to the maximum potential of about 1.5V and the FD/MN to about 3V to ensure a swing of about 1.5V before charge sharing in "high light" exposures and very good transfer in "low light" exposures. If is approach is applied to pixels of the conventional additional storage node approach, the pinned photodiode would require a maximum potential of 1.5V, the pinned MN diode would require 3V, and the FD would require 4.5V, which cannot be supported with the available 3.3V power supply. Further, even if an elevated supply voltage were available, there would still a problem to implement the MN pinned diode with the high maximum potential. Besides the design overhead when using higher voltages, additional problems can be anticipated. For example, supplying 4.5V from a charge pump is not a good solution because, at higher voltages, the generation current (electron generation rate) in the MN would be higher, and parasitic signals would appear, especially for the rows that are read out last. Thus, low light pixels read from rows at the end of a frame may appear erroneously brighter. Another problem with the conventional additional storage node approach mentioned above is that this approach suggests a p-shield, which actually increases the Vt in a part of the first transfer transistor, thus creating an additional potential barrier during electron transfer.

Various other prior art approaches attempt to achieve low-noise, full-charge-readout GS operations, but all of these prior art approaches also encounter problems. One prior art approach that attempts to modify noise reduction in GS pixels (such as those mentioned above) in order to achieve full-charge-readout is to enhance the lateral field in the transfer gate channel region. Various methods to create such a field have been investigated. For example, Boron implantation at the edge facing the photodiode was attempted, but was proven to be inefficient because the doping profile was deep and barrier lowering for electrons was difficult to achieve. Another approach taught in U.S. Pat. No. 7,825,444 to H. Rhodes (2010) includes an image sensor pixel includes indium doping in the source side of the transfer gate to generate a lateral doping profile, but the approach causes increased Vt, which in turn requires increased pixel operating voltages. Another prior art approach taught in U.S. Pat. No. 8,089,036 to Manabe et al (2012) provides an image sensor with global shutter and in-pixel storage transistor that utilizes 8T GS pixels and a CCD operation principle to possibility reduce voltage at the MN, but this approach requires two additional lines and two additional gates in comparison to the solution presented below.

What is needed is a CMOS image sensor that supports GS image capture, utilizes low-noise CDS readout operations, and facilitates decreased image distortion effects (i.e., by generation or recombination of charge in the process of the readout from first and last rows) than that of conventional approaches.

SUMMARY OF THE INVENTION

The present invention is directed to a global shutter (GS) CMOS image sensor including multiple pixels having n-type photodiodes and memory nodes formed in associated n-doped regions that are separated from an n-doped bulk substrate by an intervening p− doped vertical barrier layer. Each pixel also includes a (first) transfer gate operably configured to control the transfer of charges from the pixel's photodiode to its memory node during a global charge transfer operation, and a (second) transfer gate operably configured to control the subsequent transfer/storage of the charges from the pixel's memory node to a floating diffusion for subsequent rolling shutter readout.

According to a first aspect of the invention, the p-doped vertical barrier layer is configured to form a potential barrier between the n-doped regions and the bulk substrate that provides vertical overflow control of electrons from each pixel's photodiode to VDD. That is, electrons are drawn vertically downward from all of the photodiodes to the n-doped bulk substrate through the p-doped vertical barrier layer during global reset operations by way of increasing the bulk substrate potential to a predetermined reset voltage level, thereby completely and reliably removing any residual image data gathered in previous frame. The potential barrier function is achieved by way of forming the p-doped vertical barrier layer in a planar region extending entirely under the pixels such that it effectively functions like P-N junction diodes connected between each of the n-type photodiodes and the n-type bulk substrate. In one embodiment the GS CMOS image sensor utilizes a control circuit that is configured to apply a reset voltage onto the n-type bulk substrate that is high enough to suppress the vertical overflow barrier, whereby electrons are drawn from the photodiodes of each pixel and transmitted through the p-doped vertical barrier layer to the n-doped bulk substrate, thereby simultaneously resetting all of the photodiodes to an initial charge level during global reset operations. The control circuit is further configured to subsequently switch the bulk substrate potential from the higher reset voltage to a lower integration voltage level (i.e., at the beginning of a global shutter image capture operation) that effectively turns off the P-N junction diodes, thereby allowing electrons to collect in the photodiodes of each pixel at a rate corresponding to an amount of incident light received by each pixel, and to subsequently transfer of collected charges (image data) from the photodiode to the memory node at the beginning of a GS image capture operation. By providing the p-type vertical barrier implant between the pixels and the n-type bulk substrate, the present invention facilitates global pixel operations by way of controlling the bulk substrate potential, thereby facilitating a reduction in the size of each pixel and reducing metallization requirements by eliminating the need for a global photodiode reset transistor in each pixel. Moreover, this configuration facilitates operating the photodiodes of each pixel to collect electrons, not holes, during integration (image capture) operations, which reduces power consumption by allowing the image sensor to operate using a lower supply voltage than that required to operate image sensors formed on p-type bulk substrates.

According to another aspect of the invention, the memory node of each pixel includes two contiguous n-doped portions disposed in the second substrate region and have different doping levels: a memory node (first) buried channel portion that is disposed under part of the first transfer gate and having a first doping level, and a memory node (first) diode portion disposed below the space separating the first transfer gate and the second transfer gate and having a (second) n-type doping level that is greater (stronger) than the first n-type doping level of the buried channel portion, whereby the memory node generates an intrinsic (built-in) lateral electric field that drives (biases) electrons from the first buried channel portion into the diode portion of the memory node. When utilized in combination with the first aspect (mentioned above), the present invention provides a GS CMOS image sensor exhibiting superior low-voltage sensor operations.

According to a presently preferred embodiment, an n-doped epitaxial silicon (n-epi) layer is formed on the bulk (e.g., monocrystalline silicon) substrate, and both the n-doped regions in which the pixel photodiodes are formed and the p-type vertical barrier implant comprise associated p-type and n-type dopants diffused into corresponding regions of the n-epi layer. This configuration simplifies the fabrication process and facilitates reliable formation of the potential barrier (i.e., the p-type vertical barrier implant).

According to another aspect of the presently preferred embodiment, p-type sinker implants are formed by diffusing p-type dopant into portions of the n-epi layer next to each pixel's n-doped region such that the p-type sinker implants extend from an upper surface of the n-doped epitaxial layer to the p-type vertical barrier implant, and such that each p-type sinker implant abuts a side edge barrier of an associated pixel's n-type photodiode. This sinker implant configuration provides several benefits: first, this arrangement facilitates coupling the upper ends of the sinker implants to a low voltage potential (i.e., ground or $V_{SS}$) using standard fabrication techniques (e.g., by way of P+ contact diffusions provided for every pixel or group of pixels that are connected to a metal grid disposed outside of the pixel array); second, this arrangement facilitates reliably maintaining the p-type vertical barrier implant at the low voltage potential, which enhances its operation as a potential barrier; and third, this configuration provides a ground contact for each pixel's photodiode by way of configuring the sinker implants to abut the side edge boundaries of an associated photodiode.

According to yet another aspect of the presently preferred embodiment, each designated n-doped region (i.e., in which the photodiode and memory node of each pixel are formed) is entirely separated from surrounding portions of the n-doped substrate by the sinker implant mentioned above, the p-type vertical barrier implant, and three additional contiguous sinker implant sections that are operably joined to the sinker implant and the p-type vertical barrier implant to form a box-shaped p-doped diffusion. That is, p-type vertical barrier implant forms a lower wall section of the box-shaped diffusion, and the p-type sinker implant sections collectively form four side walls of the box-shaped diffusion. As mentioned above, the p-type vertical barrier implant occupies a horizontal plate-like portion of the n-epi layer that extends under the designated n-doped regions of all of the pixels. The p-type sinker implant sections occupy contiguous vertical wall-like portions of the n-epi layer that extend from the upper surface of the n-doped epitaxial layer the upper edge boundary of the p-type vertical barrier implant, and intersect at corners to enclose the designated n-doped region of each pixel. This box-shaped configuration facilitates isolation of each pixel's photodiode during integration operations by way containing electrons generated in response to incident light, which further enhances low voltage sensor operations.

In another embodiment, a first p-type diffusion is formed under the first buried channel portion and the first diode portion of the memory node in each pixel to facilitate forming the memory node as a pinned diode structure, and a second p-type diffusion is formed between the first buried channel portion and the first diode portion of the memory node and an upper surface of the substrate to ensure the desired operation of the buried channel portion during the transfer of charges from the photodiode to the memory node. The resulting intrinsic (built-in) lateral electric field is particularly useful when the pixel is utilized in a global shutter (GS) image sensor. That is, by providing memory node with this lateral electric field, electrons are driven more quickly from the buried channel portion into the memory node diode portion, thereby reducing dark current and decreasing image distortion in comparison with conventional GS image sensor approaches (i.e., by reducing the generation or recombination of charge in the process of a rolling shutter readout operation from first and last rows in an image sensor array). In addition, because the lateral electric field is "built-in" (i.e., exists despite the absence of an external supplied bias voltage), the present invention facilitates the use of lower pixel operating voltages. As such, the present invention facilitates the production of superior GS CMOS image sensors using present-day CMOS process technologies (i.e., 0.18 micron process flows or smaller) that exhibit superior charge transfer efficiency from the photodiode to the memory node, and from the memory node to a floating diffusion during a rolling shutter readout operation. However, although the two-part memory node structure may be particularly useful in the 5T GS CMOS image sensor arrangements described herein, the present invention may also be beneficially utilized, for example, to improve the transfer of captured charges from a pinned diode to a floating diffusion in CMOS image sensors utilizing other (e.g., 3T) pixel arrangements, or to transfer (introduce) charges in CCD or CMOS Image Sensor (CIS) systems.

According to a presently preferred embodiment of the invention, each pixel further includes a floating diffusion disposed in a second p-type sinker implant section, and a second transfer gate transistor connected between the memory node and the floating diffusion (i.e., the second transfer gate transistor controls electron flow from the memory node to the floating diffusion). In one specific embodiment, the floating diffusion of each pixel includes at least two contiguous doped regions similar to those of the memory node that generate a second intrinsic (built-in) lateral electrical field. Specifically, the floating diffusion includes a floating diffusion (second) buried channel portion disposed under the second transfer gate having a (third) doping level, and a diode portion disposed adjacent to (but not under) the second transfer gate and having a fourth doping level that is greater than the third doping level of the buried channel portion. Similar to the lateral electrical field of the memory node, the lateral electrical field of the floating diffusion functions to drive (bias) electrons from the floating channel buried channel portion into the floating channel diode portion in a way that produces more complete transfer of captured charge from the memory node to the floating diffusion, whereby the combination of the two-part memory node and the floating diffusion further facilitate the fabrication of GS CMOS image sensors by preventing dark current during rolling shutter (RS) readout operations.

According to another embodiment of the present invention, the various diode structures of each pixel are fabricated with doping profiles configured to generate relative maximum charge potentials that progressively increase as the capture charge is passed from the photodiode to the memory node to the floating diffusion. In one specific embodiment, the buried channel portion of the memory node is formed using a (first) n-type dopant having a first doping level, the memory node diode portion is produced by combining the (first) n-type dopant of the first doping process with a second n-type dopant to generate the second dopant level such that a maximum potential of the memory node diode portion is greater than that of the memory node buried channel portion. The buried channel and diode portions of the memory node are sandwiched between a p-doped diffusion layer that ensures buried channel characteristics, and a p+ doped diffusion layer that forms part of the pinned diode structure of the memory node. The formation of the buried channel portion using the first dopant and the memory node diode portion by combining the first dopant and a second dopant provides a cost-effective and accurate methodology for generating the lateral electrical field of the memory node. According to another embodiment of the present invention, the various diode structures of each pixel are fabricated with doping profiles configured to generate relative maximum charge potentials that progressively increase as the capture charge is passed from the photodiode to the memory node to the floating diffusion. Specifically, the photodiode's diode portion is fabricated with a (first) maximum charge potential that is less than (i.e., has a lower potential than) the (second) maximum charge potential of the memory node diode portion (e.g., in the range of 0.1V to 0.5V lower), and the floating diffusion (third) diode portion is fabricated with a (third) maximum charge potential that is greater than (i.e., has a higher potential than) the (second) maximum charge potential of the memory node diode portion. By providing the memory node with a potential well having a maximum potential that is greater than that of the photodiode, and by providing the floating diffusion with a maximum potential that is greater than the maximum potential of the memory node, GS pixels formed in accordance with the present invention are operably controlled using lower operating voltages, exhibit lower dark currents, and achieve superior charge transfer between the photodiode, memory node and floating diffusion, thereby facilitating the fabrication of GS CMOS image sensors having superior performance than is achievable using conventional methods.

According to another feature, the memory node and floating diffusion of each pixel are shielded from light by a light shield (e.g., a metal structure formed during metallization layer processing) that extends over the floating diffusion, the second transfer gate, the memory node, and at least a portion of the first transfer gate. With this light shielding arrangement, both the memory node and the floating diffusion are protected from "parasitic" photons that cause corruption of data.

According to a practical embodiment of the present invention, a global shutter (GS) image sensor includes an array of five-transistor (5T) pixels and associated control circuitry configured to a capture image information by way of a global shutter image capture operation followed by a rolling shutter readout operation. In addition to the photodiode, first transfer gate transistor, the memory node, second transfer gate transistor and the floating diffusion discussed above, each 5T pixel also includes a reset transistor connected between a voltage source and the floating diffusion and controlled by a reset control signal, a source-follower transistor connected to the voltage source and controlled by a charge stored on the floating diffusion, and a row-select transistor connected between said source-follower transistor and a readout signal line and controlled by a row select control signal. The 5T pixels provide the significant operating advantages described above and facilitate GS operations without the need for a global photodiode reset transistor.

According to a specific embodiment, various portions of the control circuit are utilized during operation of the GS image sensor to generate the various bulk substrate potentials and control signals mentioned above in order to cause all of the 5T pixels to simultaneously capture charges (image portions) during the global shutter image capture operation, and to read-out the captured charges from the 5T pixels on a row-by-row bases during the rolling shutter readout operation. First, a bulk (first) control circuit portion applies a global reset voltage level to the bulk substrate such that a charge stored on the photodiode of all of the pixels of the pixel array is simultaneously reset to an initial photodiode charge at the beginning of a global shutter image capture operation, then the bulk control circuit portion switches the bulk substrate potential to the lower integration voltage level such that the photodiode of each 5T pixel generates (collects) a captured charge in accordance with an amount of light received during an integration (first) phase of the global shutter image capture operation. At the end of the integration phase, a first transfer gate control signal is generated and transmitted by a second control circuit portion to the first transfer gate transistor, thereby causing each 5T pixel to transfer its captured charge from its photodiode to its memory node during a charge transfer (second) phase of the global shutter image capture operation. The rolling shutter readout operation is then performed using a correlated double sampling (CDS) readout scheme in which the pixel rows are sequentially accessed during corresponding row-select time period, and SHR control signals and SHS control signals are transmitted only to the 5T pixels of one selected row during each corresponding row-select time period. During an SHR (first) phase of each row-select time period, each 5T pixel of the selected row is controlled by SHR control signals such that its floating diffusion stores a reset charge that is transmitted onto an associated column line as an SHR value. During the subsequent SHS (second) phase of each row-select time period, each 5T pixel of the selected row is controlled by SHR control signals to transfer its captured charge from its memory node to its floating diffusion of each said pixel, which is then transmitted onto the associated column line as an SHS value. By controlling the 5T pixels to perform CDS readout operations in this manner, the present invention facilitates further noise reduction in the image data read out from the array.

According to a preferred embodiment, both the photodiode and memory node in each pixel comprise pinned diode structures. As mentioned above, the generation of the intrinsic lateral electrical field drives electrons more quickly into the memory node diode portion, whereby pixels generated in accordance with the present invention provide the benefit of utilizing pinned diode structures (i.e., the reduction of parasitic current generation) without experiencing the delay effects associated with conventional approaches. According to a feature of the practical GS image sensor embodiment described above, due to the pinned diode structures and the presence of the memory node buried channel region, the first transfer gate transistor of each 6T pixel is controllable using only two voltage levels (i.e., the transfer gate control signal is either VDD or 0V). This is a very attractive feature because it avoids the need for a third "store" control voltage and associated three-level drivers, which are needed in pixel arrangements that require charge storage under the transfer gate, thus simplifying the control circuit and reducing overall costs.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in CMOS image sensors, and more particularly to improvements in global shutter (GS) CMOS image sensors for use in machine vision and in other high resolution applications that require low noise global shutter operation. The following description is presented to enable one of ordinary skill in the art to make and use the invention as provided in the context of a particular application and its requirements. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). In addition, relative terms such as "upper", "uppermost", "above", "below", "downward", "vertical", "vertically", "horizontally" and "under" are intended to denote relative differences, and not intended to be literally interpreted unless otherwise specified. The terms "n-doped" and "n-type" refer to semiconductor material having a predominantly n-type doping profile (i.e., a higher concentration of n-type dopant(s) than p-type dopant(s)), whereas the terms "p-doped" and "p-type" refer to semiconductor material having a predominantly p-type doping profile (i.e., a higher concentration of p-type dopant(s) than n-type dopant(s)). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
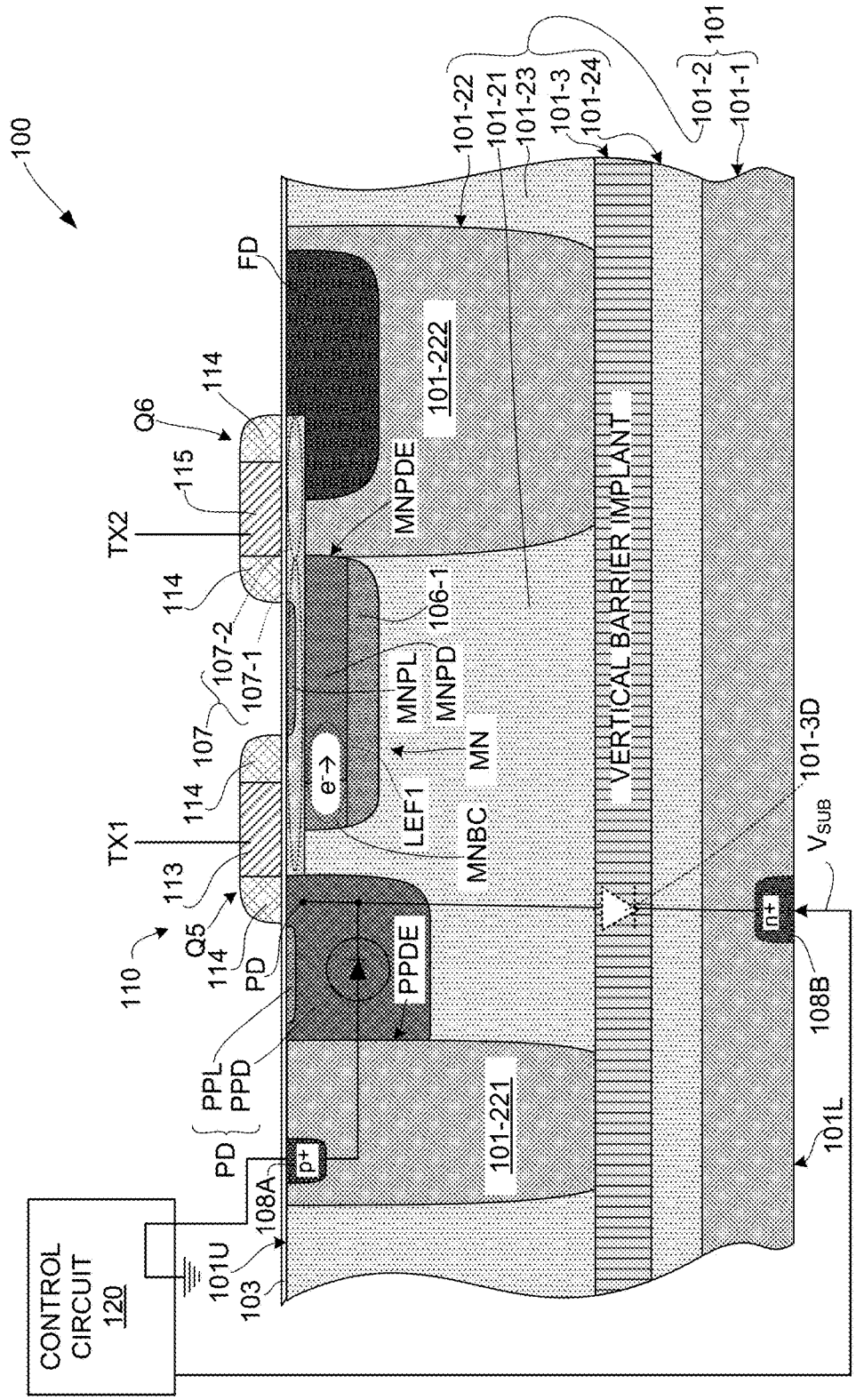
FIGS. 1(A) and 1(B) are cross-sectional and pseudo exploded perspective views showing a partial GS CMOS image sensor including one pixel formed in accordance with a simplified embodiment of the present invention.
Figure 1B:
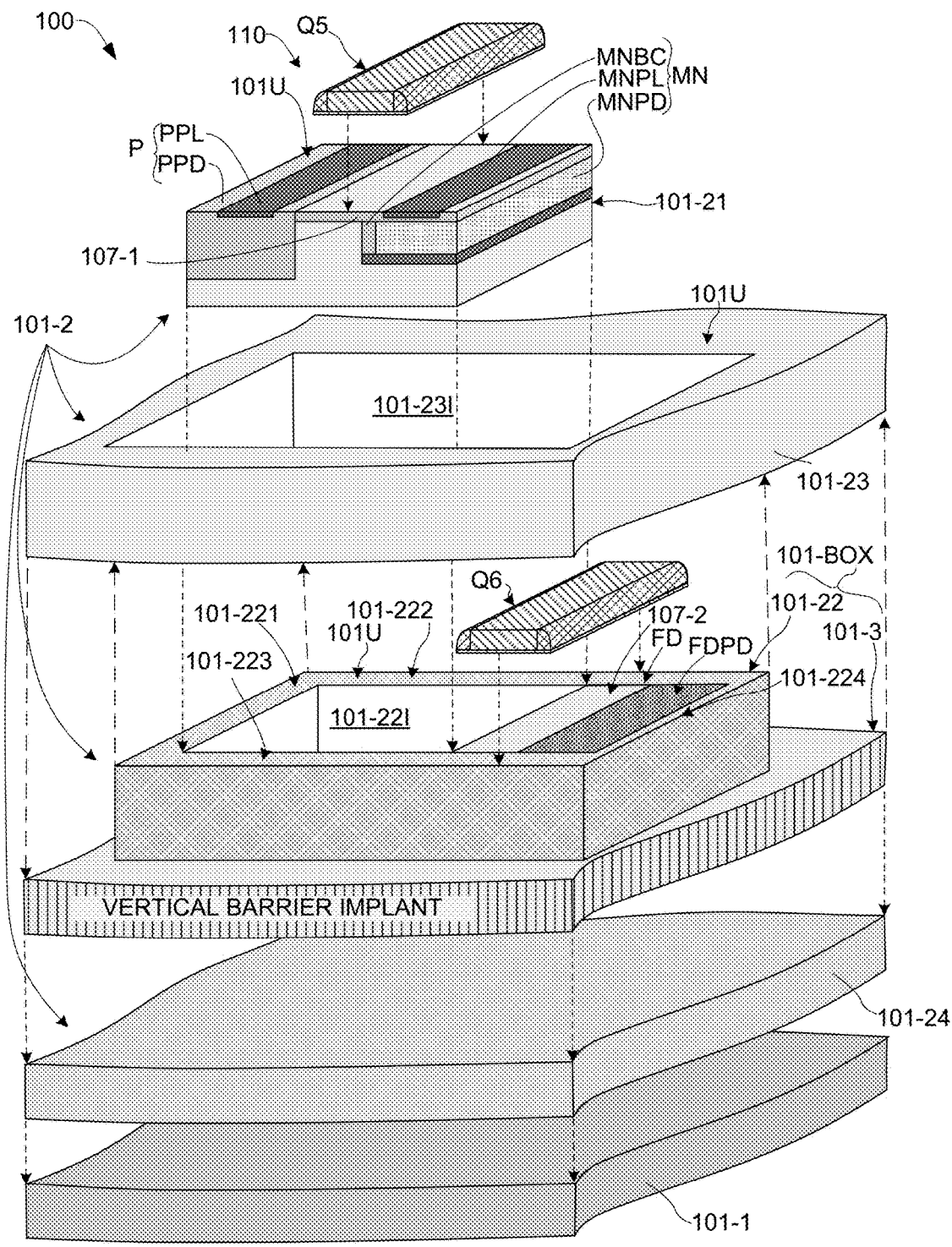

FIG. 1(A) shows a partial CMOS global shutter (GS) image sensor 100 formed on a semiconductor substrate 101 including a simplified pixel 110. Pixel 110 is understood as being one of many pixels that collectively form GS image sensor 100 in the manner set forth below. Note that the details of pixel 110 shown in these figures are intended to depict novel aspects of image sensor 100. That is, FIGS. 1(A) and 1(B) illustrate only the structures of image sensor 100 that are considered novel with respect to conventional approaches, and additional structures required to implement a functional pixel circuit are omitted for clarity. Specifically, a second storage element (e.g., the floating diffusion discussed below) and pixel control elements (e.g., additional transfer gate, reset, source-follower and select transistors needed to allow pixel 110 to capture, store and readout image information) are omitted from FIG. 1(A) to more clearly depict the novel structures and features, and because these control portions may be implemented using a number of different circuit arrangements in combination with the depicted novel structures and features.

Referring to FIG. 1(A), substrate 101 includes a p-type vertical barrier implant 101-3 sandwiched between an n-doped bulk substrate 101-1 and an n-doped region 101-21 in which pixel 110 is partially formed. In one embodiment, substrate 101 includes an n-doped epitaxial silicon (n-epi) layer 101-2 formed on bulk substrate 101-1. In an exemplary embodiment, n-doped bulk substrate 101-1 comprises monocrystalline silicon having one or more of an n-type doping concentration in the range of $1\times10^{18}$ to $1\times10^{20}$ atoms/cm$^3$ or a conductivity in the range of 1 mOhm/cm to 100 mOhm/cm. As indicated at the right edge of FIG. 1(A), epitaxial layer 101-2 is formed as an integral layer on upper surface 101-1U of bulk substrate 101-1, and includes a designated n-doped region 101-21, an intermediate p-doped sinker implant region 101-22 that surrounds n-doped region 101-21, an exemplary surrounding n-doped region 101-23 that surrounds p-doped sinker implant region 101-22, p-type vertical barrier implant region 101-3, and an optional additional n-epi region 101-24 disposed between p-type vertical barrier implant region 101-3 and bulk substrate 101-1. In an exemplary embodiment, intrinsic portions of n-epi layer 101-2 (e.g., n-doped regions 101-21, 101-23 and 101-24) have one or more of an n-type doping concentration in the range of $1\times10^{13}$ to $5\times10^{15}$ atoms/cm$^3$ or a conductivity in the range of 10 kOhm/cm to 5 Ohm/cm. In one embodiment, p-type vertical barrier implant 101-3 and p-type sinker implant region 101-22 comprise p-doped epitaxial material having a p-type doping concentration in the range of $1\times10^{14}$ to $5\times10^{16}$ atoms/cm$^3$, and are formed by diffusing one or more p-type dopants into corresponding portions of n-type epitaxial layer 101-2 using known techniques.

Referring to FIG. 1(A), pixel 110 includes a photodiode P, a memory node MN and a floating diffusion FD that are formed by dopants diffused into n-epi layer 101-2, and a (first) transfer gate transistor Q5 and a (second) transfer gate transistor Q6 that are disposed on a gate oxide layer 103, which is formed on an upper surface 101U of substrate 101 (i.e., the uppermost surface of n-epi layer 101-2) using known techniques. Photodiode P is at least partially formed by diffusing one or more n-type dopants into a first portion of n-type region 101-21, and memory node MN is at least partially formed by diffusing n-type dopants into a second portion of n-type region 101-21 such that portions of the n-type dopants forming both photodiode P and memory node MN contact n-type region 101-21, and such that photodiode P and memory node MN are separated by a third (channel) portion of n-type region 101-21 (i.e., photodiode P and memory node MN are formed in a spaced-apart relationship within n-type region 101-21). Transfer gate Q5 includes a doped polycrystalline silicon (polysilicon) gate structure 113 and associated sidewall spacers 114 that are formed using known techniques, and is operably disposed over a shallow p-type surface diffusion portion 107-1 that extends along upper surface 101U between photodiode P and memory node MN such that a flow of electrons between photodiode P and memory node MN is controlled by transfer gate (first) control signal TX1. Floating diffusion FD is formed outside of n-type region 101-21 in the manner described below such that floating diffusion FD is spaced from memory node MN by a corresponding channel region. Transfer gate Q6 includes a polysilicon gate structure 115 and associated sidewall spacers 114 that are operably disposed over a shallow p-type surface diffusion portion 107-2 that extends along upper surface 101U between memory node MN and floating diffusion FD such that a flow of electrons between memory node MN and floating diffusion FD is controlled by transfer gate (second) control signal TX2. IN one embodiment, shallow p-type surface diffusion portions 107-1 and 107-2 form a contiguous shallow p-type surface diffusion 107 that extends between photodiode P and floating diffusion FD under transfer gates Q5 and Q6.

According to another aspect of the invention, p-doped vertical barrier layer 101-3 is configured to form a vertical overflow (potential) barrier between n-doped regions 101-21 and bulk substrate 101-1 such that electrons are drawn vertically downward from photodiode P to n-doped bulk substrate 101-1 through p-doped vertical barrier layer 101-3 during reset operations by way of increasing the bulk substrate potential $V_{SUB}$ to a predetermined reset voltage level (e.g., $V_{DD}$). In one embodiment, p-doped vertical barrier layer 101-3 is formed in a planar region extending entirely under pixel 110 such that it effectively functions like a P-N junction diode 101-3D connected between n-type photodiode P and n-type bulk substrate 101-1.

In one embodiment, image sensor 100 includes a control circuit 120 that is fabricated on substrate 101 and configured to switch a substrate potential $V_{SUB}$ of bulk substrate 101-1 between two or more voltage levels (e.g., by way of a backside-contact 108B formed on lower surface 101L of bulk substrate 101-1, or more preferably using an N-well ring that surrounds the pixels, where the NW ring is connected to the bulk substrate through the n-epi to control the $V_{SUB}$ potential). In a presently preferred embodiment, control circuit 120 is configured to switch substrate potential $V_{SUB}$ between a relatively high reset voltage level (referred to herein as reset voltage level $V_{GRST}$) and a relatively low integration voltage level (referred to herein as integration voltage level $V_{INT}$). Reset voltage level $V_{GRST}$ is generated at a high enough voltage level to suppress the vertical overflow barrier during global reset operations, whereby electrons are drawn downward from photodiode P and transmitted through p-doped vertical barrier layer 101-3 to n-doped bulk substrate 101-1, thereby resetting photodiode P to an initial charge level for the beginning of a subsequent GS image capture (integration) operation. Control circuit 120 is further configured to subsequently switch bulk substrate potential $V_{SUB}$ from reset control voltage level $V_{GRST}$ to the lower integration voltage level $V_{INT}$ at the beginning of a GS image capture operation, where the lower voltage level of integration voltage level $V_{INT}$ effectively turns off P-N junction diode 101-3D, thereby allowing electrons to collect in the photodiode P at a rate corresponding to an amount of incident light received by pixel 110, and to allow electrons to be transferred to memory node MN for storage at the end of the GS image capture operation. By providing p-type vertical barrier implant 101-3 between pixels 110 and n-type bulk substrate 101-1 and facilitating vertical overflow control of pixel 110 by way of switching bulk substrate potential $V_{SUB}$ in this manner, the present invention facilitates GS image capture operations of image sensor 100 without the need for a global photodiode reset transistor in each pixel of image sensor 100, thereby facilitating a reduction in the size and or complexity of pixel 110. Moreover, this vertical overflow control configuration facilitates forming n-type photodiode P in n-doped material (i.e., n-type region 101-21), which in turn facilitates operating photodiode P such that it collects electrons, not holes, during integration (image capture) operations, which reduces power consumption by allowing image sensor 100 to operate using a lower supply voltage than that required to operate n-type photodiodes formed in p-doped substrate material.

According to another aspect of the present invention, memory node MN includes two or more contiguous n-doped regions having different n-type doping levels that are configured to generate an intrinsic (built-in) lateral electric field LEFT that facilitates the transfer of captured charges from photodiode P to memory node MN. Specifically, memory node MN includes two contiguous doped regions referred to as (first) buried channel portion MNBC and (first) diode portion MNPD. Buried channel portion MNBC is formed by a first diffused n-type dopant material using the modified CMOS technique described below such that it is disposed under a portion of transfer gate Q5 and has a first doping level, and diode portion MNPD is formed by a second n-type dopant material (i.e., a different dopant material or a combination of the first dopant material with a different dopant material) such that diode portion MNPD is disposed between buried channel portion MNBC and floating diffusion FD and has a second doping level. To generate intrinsic lateral electric field LEF1, the second doping level of diode portion MNPD is greater (higher or stronger) than the first doping level of buried channel portion MNBC, whereby electrons are driven (biased) by lateral electrical field LEF1 from buried channel portion MNBC into diode portion MNPD (i.e., as depicted by "e→" and the rightward-pointing arrow superimposed onto memory node MN in FIG. 1(A)). In a preferred embodiment, a first p-type diffusion 106-1 is formed under buried channel portion MNBC and diode portion MNPD to facilitate forming memory node MN as a pinned diode structure, and second p-type diffusion portion 107-1 is formed between upper surface 101U and portions MNBC and MNPD of memory node MN to ensure the desired operation of buried channel portion MNBC during the transfer of charges from photodiode P to the memory node MN. Providing memory node MN with lateral electric field LEF1 facilitates driving electrons more quickly from buried channel portion MNBC into node diode portion of the memory, thereby reducing dark current and decreasing image distortion in comparison with conventional approaches (i.e., by reducing the generation or recombination of charge in the process of a rolling shutter readout operation from first and last rows in an image sensor array). In addition, because lateral electric field LEF1 is "built-in" (i.e., exists despite the absence of an external supplied bias voltage), the present invention facilitates the use of lower pixel operating voltages. As such, the present invention facilitates the production of superior GS CMOS image sensors using present-day CMOS process technologies (i.e., 0.18 micron process flows or smaller) that provide superior charge transfer efficiency from photodiode P to memory node MN, and from memory node MN to floating diffusion FD during a rolling shutter readout operation.

Referring to FIG. 1(A), in a preferred embodiment both photodiode P and memory node MN comprise pinned diode structures that are formed by p-type dopants diffused into associated portions of designated n-doped region 101-21. Photodiode P is configured using known techniques to generate a captured charge in accordance with an amount of light received by pixel 110 during an integration phase of a global shutter image capture operation, such as that described in further detail below. In the preferred embodiment, photodiode P includes a photodiode structure PPD (e.g., an n-type diffusion extending downward from upper surface 101U) and a (first) pinning layer PPL (e.g., formed by a shallow p+ diffusion layer disposed adjacent to upper surface 101U). Similarly, memory node MN is configured using known techniques to store a captured charge transferred from photodiode P during a charge transfer phase of a global shutter image capture operation, such as that described in further detail below, and includes a (second) pinning layer MNPL (e.g., formed by a p+ dopant formed in shallow p-type surface diffusion portion 107-1 disposed adjacent to upper surface 101U) that is disposed above n-type memory node diode portion MNPD. Similar to that achieved in conventional approaches, the benefit of implementing photodiode P and memory node MN using pinned diode structures is that this arrangement reduces parasitic current generation. However, unlike the conventional approaches, the delay effects associated with using pinned diode structures is avoided in the present invention by way of lateral electrical field LEFT.

Referring to the left side of FIG. 1(A), in accordance with another aspect of the present invention pixel 110 further includes a p-type sinker implant 101-221 formed by one or more p-type dopants diffused into an associated portion of n-epi layer 101-2 that is adjacent to designated region 101-21 such that p-type sinker implant 101-221 extends between upper substrate surface 101-U (i.e., the upper surface of n-epi layer 101-2) and p-type vertical barrier implant 101-3, and such that a portion of p-type sinker implant 101-221 abuts (contacts) a side edge boundary PPDE of photodiode structure PPD. Sinker implant 101-221 performs at least the following three functions during operation of GS image sensor 100. First, as indicated in FIG. 1(B) the upper end of sinker implant 101-221 is coupled (e.g., by way of control circuit 120) to a ground (or another low voltage potential) using standard fabrication techniques (e.g., by way of one or more P+ contact diffusions 108A and associated metallization). Second, because the lower end of sinker implant 101-221 contacts p-type vertical barrier implant 101-3, sinker implant 101-221 functions to maintain the p-type vertical barrier implant 101-3 at a low voltage potential, which enhances the operation of p-type vertical barrier implant 101-3 as a potential barrier. Third, because sinker implant 101-221 abuts side edge boundary PPDE of photodiode P, sinker implant 101-221 facilitates coupling the anode of photodiode P to ground during operation.

Referring to FIG. 1(B), according to a presently preferred embodiment, pixel 110 further includes additional sinker implant sections 101-222, 101-223 and 101-224 that combine with sinker implant 101-221 and p-type vertical barrier implant 101-3 to collectively form a box-shaped diffusion 101-BOX that entirely separates designated n-doped region 101-21 from surrounding n-epi layer portions 101-23 and from bulk substrate 101-1. FIG. 1(B) depicts pixel 110 in a pseudo exploded perspective format in which the various different doped regions disposed in n-epi layer 101-2 are separated for illustrative purposes. That is, epitaxial layer 101-2 is formed as an integral layer on upper surface 101-1U of bulk substrate 101-1, and includes designated n-doped region 101-21, intermediate p-doped sinker implant region 101-22 (which surrounds n-doped region 101-21), n-doped region 101-23 (which surrounds p-doped sinker implant region 101-22), and p-type vertical barrier implant region 101-3 (which extends under n-doped region 101-21, p-doped sinker implant region 101-22, and surrounding n-doped region 101-23). As depicted near the bottom of FIG. 1(B), p-type sinker implant sections 101-221, 101-222, 101-223 and 101-224 collectively form four side walls of box-shaped diffusion 101-BOX that entirely separate n-type region 101-21 from surrounding n-epi layer portions 101-23, and p-type vertical barrier implant 101-3 forms a lower wall of box-shaped diffusion 101-BOX that entirely separate n-type region 101-21 from bulk substrate 101-1 (and any n-epi material that might be disposed between p-type vertical barrier implant 101-3 and upper bulk surface 101-1U of bulk substrate 101-1). As indicated by sinker implant 101-222 in FIG. 1(A), each of sinker implant sections 101-222, 101-223 and 101-224 extend from upper surface 101U to p-type vertical barrier implant 101-3. Referring again to FIG. 1(B), as indicated by the dash-lined arrows, n-type region 101-21 occupy an interior region 101-221 defined by box-like diffusion 101-BOX, and both n-type region 101-21 and p-doped sinker implant region 101-22 occupy an interior region 101-231 surrounded by surrounding n-epi layer portions 101-23. Box-shaped diffusion 101-BOX facilitates isolation of photodiode P and memory node MN during the pixel operations described below by way preventing the undesirable escape of electrons from n-type region 101-21 during integration and transfer.

In a practical embodiment in which image sensor 100 includes multiple pixels, p-type vertical barrier implant 101-3 occupies an integral (single, continuous) horizontally oriented plate-like portion of n-epi layer 101-2 that extends under the designated n-doped regions 101-21 of all of the pixels. Note that, in such practical embodiments, p-doped sinker implant region 101-22 may be formed in elongated rows and columns that delineate an array of n-type regions (e.g., identical to n-type region 101-21) that are occupied by the multiple pixels, whereby surrounding n-epi layer portions 101-23 do not form the contiguous structure depicted in FIG. 1(B). In other embodiments, a separate p-type vertical barrier implants and separate sinker implant regions may be formed under each pixel, as indicated in FIG. 1(B).

Referring again to FIG. 1(A), according to an aspect of the preferred embodiment, floating diffusion FD is formed by n-type dopants diffused inside p-type sinker implant section 101-222 and located adjacent to n-type region 101-21 such that floating diffusion FD is spaced from memory node MN by a portion of p-type sinker implant section 101-222. In the preferred embodiment, shallow p-type surface diffusion portion 107-2 extends over the portion of p-type sinker implant section 101-222 separating memory node MN and floating diffusion FD, and extends over a portion of the n-type doped region forming floating diffusion FD. As mentioned above, the transfer of charges from memory node MN to floating diffusion FD is controlled by transfer gate Q6. Note that an inside edge of p-type sinker implant section 101-222 abuts an outside edge MNPDE of memory node diode portion MNPD.

Figure 2A:
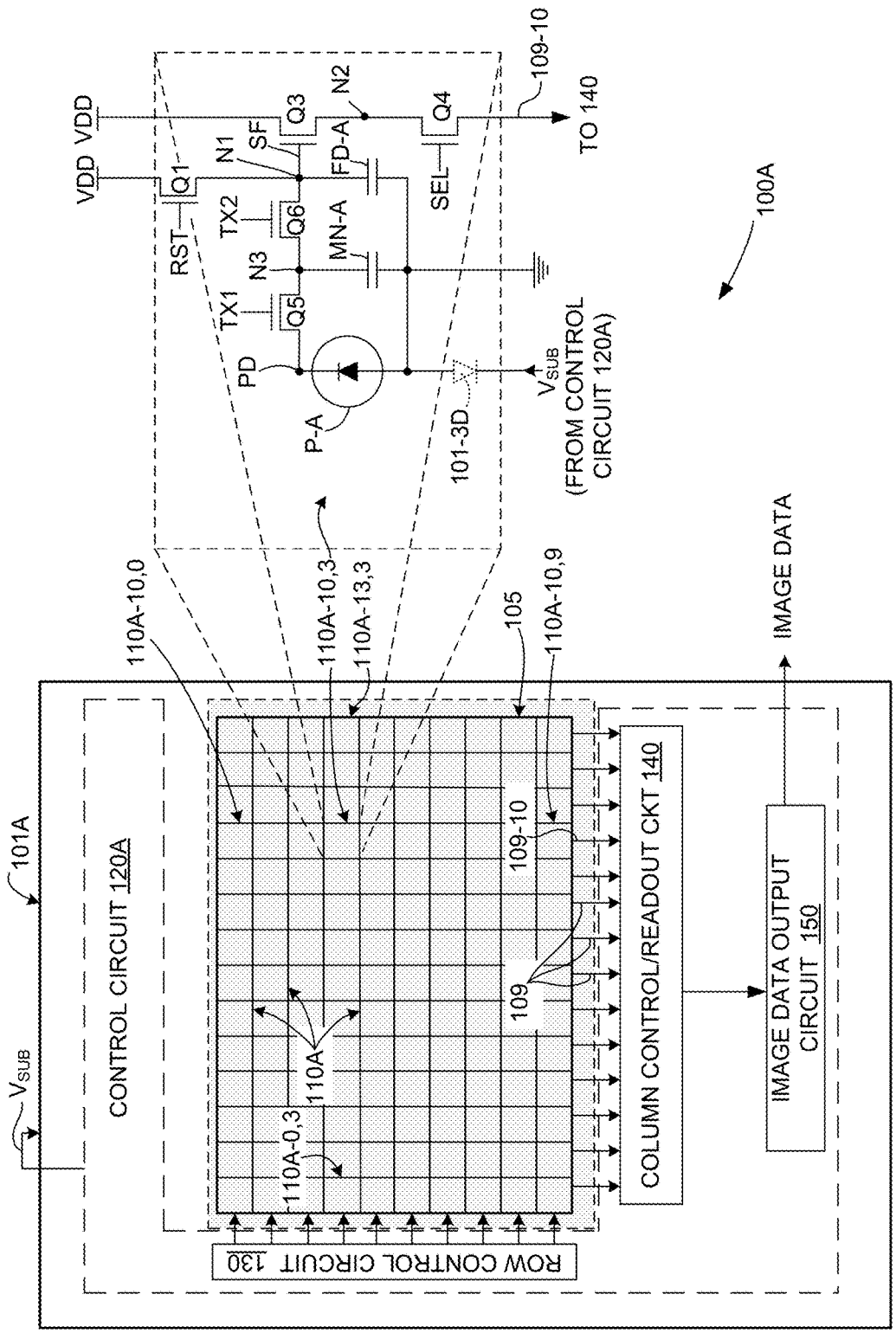
FIG. 2(A) is a hybrid block/circuit diagram showing a GS CMOS image sensor according to another embodiment of the present invention.

FIG. 2(A) is a simplified diagram showing a simplified GS CMOS image sensor 100A formed in accordance with another simplified embodiment of the present invention. CMOS image sensor 100A is similar to conventional GS CMOS image sensors in that it is formed using CMOS fabrication techniques on a semiconductor substrate 101A, and includes a pixel array 105 including five-transistor (5T) pixels 110A arranged in rows and columns, where each 5T pixel 110A is consistent with pixel 110 described above with reference to FIG. 1(A), and is described in further detail below with reference to FIG. 2(B). CMOS image sensor 100A also includes a control circuit 120A that facilitates the application of bulk substrate potential $V_{SUB}$ to substrate 101A, e.g., by way of a backside contact or an N-Well ring formed in the n-epi layer around array 105 and directly connected to the n-type bulk substrate 101-1A, and facilitates control of pixels 110A by way of control signals transmitted on associated metal control lines (not shown) such that all pixels 110A of array 105 are controlled to simultaneously capture associated charges (light image portions) during a global shutter image capture operation, and then to transfer the captured charges in a rolling shutter (row-by-row) readout operation in the manner described below.

In the exemplary simplified embodiment, pixel array 105 is arranged such that the columns of pixels 110A are aligned in one orthogonal direction (e.g., vertically), and the pixel rows are aligned in a perpendicular second orthogonal direction (e.g., horizontally). For example, pixels 110A-10,0, 110A-10,3, and 110A-10,9, which are aligned vertically in FIG. 2(A), form one of fourteen pixel columns, and pixels 110A-0,3, 110A-10,3, and 110A-13,3, which are arranged horizontally, form one of ten pixel rows. Similar to other global shutter image sensors, all pixels 110A of array 105 are simultaneously exposed to capture light from a subject image during an integration phase, and then the pixel rows are accessed sequentially during a rolling shutter readout operation by way of control signals that are described below, and captured analog signals generated by each pixel are transmitted on column signal lines 109. For example, during a first time period of the RS readout operation, all of the pixels in the first row of pixel array 105 (e.g., pixel 110A-10,0) are accessed using the method described below, and analog values generated by the first row are transmitted onto associated column output signal lines (e.g., signal line 109-10). Those skilled in the art will recognize that pixel array 105 is shown with a small number of pixels for explanatory purposes, and that an actual sensor formed in accordance with the present invention for would typically include between 2,000,000 and 60,000,0000 pixels, although aspects of the present invention may be beneficially utilized in image sensors having fewer pixels or a larger number of pixels.

A simplified 5T GS pixel 110A-10,3, which is exemplary of all pixels 110A in array 105, is shown in an enlarged fashion in the upper right portion of FIG. 2(A). Consistent with pixel 110 of FIG. 1(A), each 5T GS pixel 110A of CMOS image sensor 100A (e.g., pixel 110A-10,3) includes a CMOS pinned photodiode P-A, a memory node MN-A, a floating diffusion FD-A, a first transfer gate transistor Q5 and a second transfer gate transistor Q6. Note that photodiode P-A is coupled between ground (e.g., by way of p-type sinker implant 101-221A as described above with reference to FIG. 1(B) and shown in FIG. 2(B)) and a photodiode node PD, which is coupled to an effective P-N junction diode 101-3D in the manner described above with reference to FIG. 1(B), and to a terminal of transfer gate Q5. In addition, each 5T GS pixel 110A of CMOS image sensor 100A includes a reset select transistor Q1, a source-follower transistor Q3, and a select transistor Q4, which are depicted in schematic form for clarity. Reset transistor Q1 is coupled between system voltage source VDD and a first internal node N1 that is also connected to floating diffusion FD-A and to the gate terminal of source-follower transistor Q3, and is controlled by a control signal RST. Source-follower transistor Q3 is connected between system source VDD and a second internal node N2, and is controlled by a voltage present on first node N1 to generate a pixel output signal at node N2. Select transistor Q4 is connected between associated column signal (output) line 109-10 and node N2, and receives a select control signal SEL during the read operations that couples node N2 to signal line 109-10. Memory node MN-A and floating diffusion FD-A are represented by capacitor symbols in FIG. 2(A) for illustrative purposes, and store captured analog signals (charges) on an internal node N3 and on first node N1, respectively, in the manner described below.

Figure 2B:
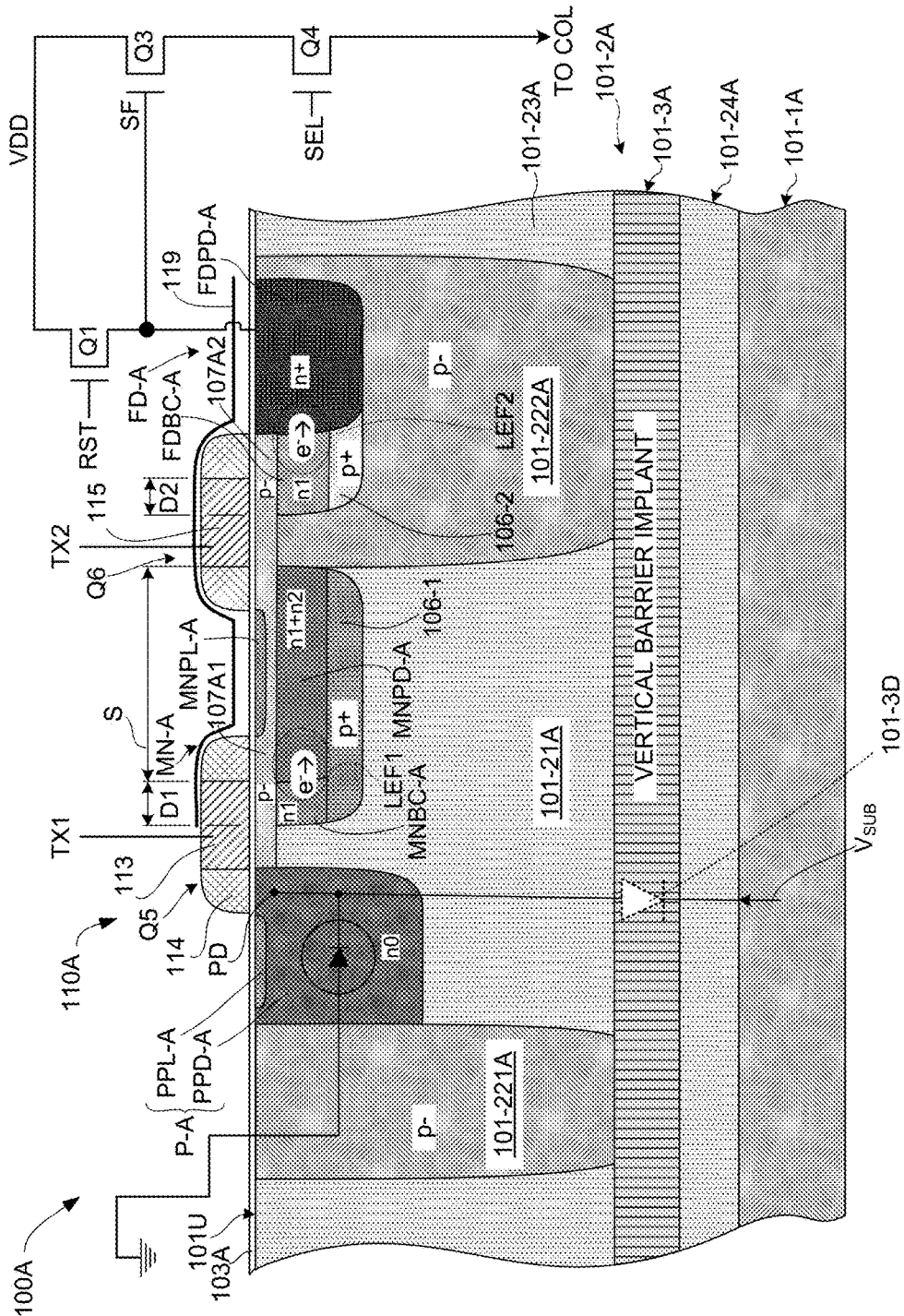
FIG. 2(B) is a hybrid schematic/cross-sectional side view showing a portion of a 5T pixel utilized in the GS CMOS image sensor of FIG. 2(A)

FIG. 2(B) shows an exemplary 5T pixel 110A of image sensor 100A in additional detail. Image sensor 100A is formed on a substrate 101A including bulk substrate 101-1A and n-epi layer 101-2A, where various portions of n-epi layer 101-2A are processed to provide p-type sinker implants (e.g., sinker implants 101-221A and 101-222A) and a vertical barrier implant 101-3A that separate an n-type region 101-21A in which pixel 110A is formed from other n-type structures (e.g., surrounding n-epi regions 101-23A and underlying n-epi region 101-24A). Similar to FIG. 1(A), FIG. 2(B) illustrates only structures of pixel 110A that are considered novel with respect to conventional approaches, and additional structures required to implement a functional pixel circuit are depicted schematically for clarity. Moreover, structures that are essentially identical to corresponding structures shown in FIG. 1(A) are identified using the same reference numbers, and complete description of these structures is omitted below for brevity.

Pixel 110A is similar to those of pixel 110 (FIG. 1(A)) in several respects. Photodiode P-A and memory node MN-A are formed in designated n-type region 101-21A of n-epi layer 101-2A and coupled by transfer gate Q5. As described above, n-type region 101-21A is isolated from surrounding n-doped regions (e.g., n-doped bulk substrate 101-1A, surrounding n-epi regions 101-23A, and optional underlying n-epi regions 101-24A) by a box-like diffusion formed by p-type sinker implant sections (e.g., sections 101-221A and 101-222A) and a p-type vertical barrier implant 101-3A. First transfer gate Q5 is disposed on gate oxide layer 103A formed on an upper surface 101U of n-epi layer 101-2A, and is controlled by first transfer gate control signal TX1. Floating diffusion FD-A is formed in p-type sinker implant section 101-222A, and is coupled to memory node MN by way of a second transfer gate transistor Q6, which is controlled by second transfer gate control signal TX2. As in pixel 110 (FIG. 1(A)), transfer gate Q5 includes a polysilicon gate structure 113 and associated sidewall spacers 114, and is operably disposed over a channel (gap) separating photodiode P-A and memory node MN-A. Transfer gate Q6 also includes a doped polysilicon gate structure 115 and associated sidewall spacers 116, and is operably disposed over a channel (gap) separating memory node MN-A and floating diffusion FD-A such that a flow of electrons between memory node MN-A2.

According to an aspect of the embodiment shown in FIG. 2(B), photodiode P-A, memory node MN-A and floating diffusion FD-A are formed using various n-type dopants that are combined to generate desirable doping profiles. For example, photodiode P-A includes photodiode portion PPD-A formed with an associated n-type dopant profile (labeled "n0" to distinguish this dopant profile from the other n-type dopant profiles used in memory node MN-A and floating diffusion FD-A) and a p+ pinning layer PPL-A. Memory node MN-A includes buried channel portion MNBC-A formed with an associated (first) n-type dopant profile n1 that extends a distance D1 under polysilicon gate structure 113 of transfer gate transistor Q5, a diode portion MNPD-A formed with an associated second n-type dopant profile (labeled "n1+n2" to distinguish this dopant profile from dopant profile n1) that is disposed in the gap region formed between transfer gate transistors Q5 and Q6, and a p+ pinning layer MNPL-A formed in the surface of substrate 101A between transfer gate transistors Q5 and Q6. In addition, p-type diffusion 106-1 is formed under buried channel portion MNBC-A and diode portion MNPD-A to facilitate function of memory node MN-A as a pinned diode structure, and shallow p-type surface diffusion portion 107-1 is formed between buried channel portion MNBC-A and diode portion MNPD-A and upper substrate surface 101U to ensure the desired operation of the buried channel portion MNBC-A (i.e., p-type diffusion 107-1 acts as a diffusion barrier for photoelectrons that are not collected by the diode structure). The composition and depth of diffusion 107-1 depends on several factors including the resistivity of the n-type dopants forming buried channel portion MNBC-A and diode portion MNPD-A.

According to the second embodiment, in addition to forming memory node MN-A using two or more contiguous doped regions having different doping levels, floating diffusion FD-A is also formed using two or more contiguous doped regions having different doping levels that are configured to generate a second intrinsic (built-in) lateral electric field LEF2 that facilitates the transfer of captured charges from memory node MN-A to floating diffusion FD-A. In the embodiment depicted in FIG. 2(B), floating diffusion FD-A includes two contiguous doped regions referred to as (second) buried channel portion FDBC-A and (second) diode portion FDPD-A, where buried channel portion FDBC-A is formed with n-type dopant profile n1, and a diode portion FDPD-A is formed with an associated third n-type dopant profile (labeled "n+" to distinguish this dopant profile from that of diode portion MNPD-A). The n1 material forming buried channel portion FDBC-A is disposed under a portion of transfer gate Q6 (i.e., extends from diode portion FDPD-A a distance D2 under polysilicon gate structure 115) and shallow p-type surface diffusion portion 107-2, and has an associated (third) doping level (which may be equal to the first doping level of buried channel portion MNBC-A). Diode portion FDPD-A is formed by dopant material disposed to the right of transfer gate Q6 and having a fourth doping level. To generate intrinsic lateral electric field LEF2, the (fourth) doping level of diode portion FDPD is greater (higher or stronger) than the (third) doping level of buried channel portion FDBC-A, whereby electrons are driven by lateral electrical field LEF2 from buried channel portion FDBC-A into diode portion FDPD-A (i.e., as depicted by "e⁻" and the rightward-pointing arrow superimposed onto floating diffusion FD in FIG. 2(B)). Shallow p-type diffusion 107-2 has the same composition as diffusion 107-1, and is formed between buried channel portion FDBC-A and upper substrate surface 101U to ensure the desired buried channel operation, and a p-type diffusion 106-2 is formed under buried channel portion FDBC-A having the same composition as that of diffusion 106-1. As explained in additional detail below, providing memory node MN-A with lateral electrical field LEFT and floating diffusion FD-A with lateral electric field LEF2 facilitates further reducing dark currents and decreasing image distortion in comparison with conventional approaches, and further facilitates the use of lower pixel operating voltages, thereby facilitating the production of superior GS CMOS image sensors using present-day CMOS process technologies that provide superior charge transfer efficiency from photodiode P-A to memory node MN-A, and from memory node MN-A to floating diffusion FD-A during a rolling shutter readout operation.

According to another feature of the preferred embodiment illustrated in FIG. 2(B), buried channel portions FDBC-A and MNBC-A are formed using the same (first) n-type dopant n1 (i.e., buried channel portions FDBC-A and MNBC-A are simultaneously formed during the same diffusion process), diode portion MNPD-A of memory node MN-A consists essentially of a combination of n-type dopant n1 and a second n-type dopant n2 that provides memory node MN-A with a greater maximum potential than that of photodiode P-A, and diode portion FDPD-A of floating diffusion FD-A comprises a different (third) n-type dopant n+ that provides floating diffusion FD-A with a greater maximum potential than that of memory node MN-A. That is, as described in additional detail below, the potential well of diode portion MNPD-A has a maximum potential that is greater than the maximum potential of photodiode P-A, and the potential well of diode portion FDPD-A has a maximum potential that is greater than the maximum potential of diode portion MNPD-A. By providing memory node MN-A with a greater maximum potential than that of photodiode P-A, and by providing floating diffusion FD-A with a greater maximum potential than that of memory node MN-A, pixel 110A can be controlled using lower operating voltages, exhibits lower dark currents, and achieves superior charge transfer that is superior to that achievable using conventional methods.

According to another feature of the preferred embodiment illustrated in FIG. 1(B), memory node MN-A is shielded from light by an integral metallization (e.g., M1) structure 119 disposed over floating diffusion FD, transfer gate Q6, memory node MN-A, and the portion of transfer gate Q5 disposed over buried channel portion MNBC-A. With this light shielding arrangement, both memory node MN-A and floating diffusion FD-A are protected from "parasitic" photons that cause corruption of data.

Figure 3:
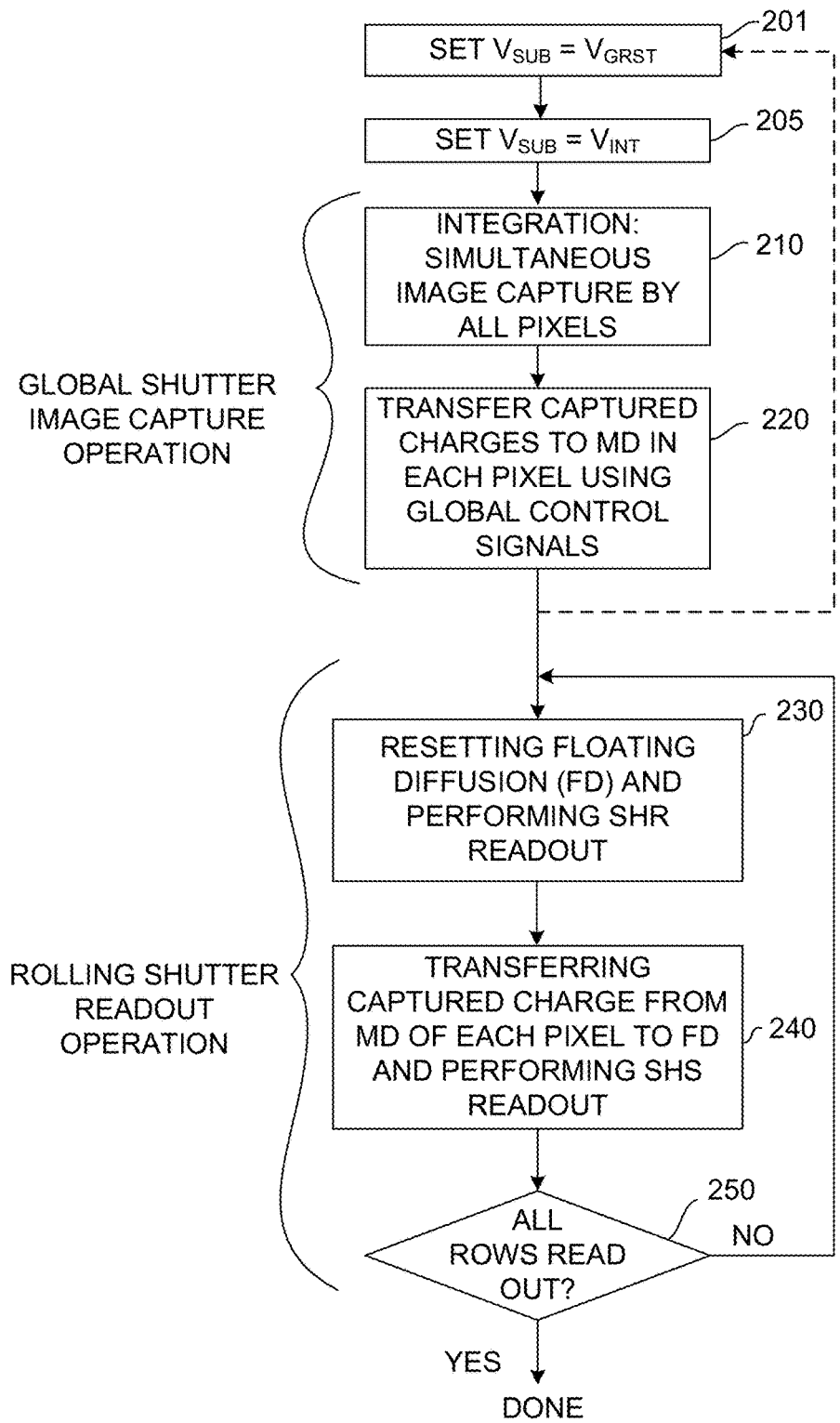
FIG. 3 is flow diagram showing a simplified methodology for generating image data from the GS CMOS image sensor of FIGS. 2(A) and 2(B)

FIG. 3 is a simplified flow diagram depicting the operation of image sensor 100A as a GS image sensor utilizing control circuit 120A (see FIG. 2(A)) according to another embodiment of the present invention. The method generally includes a global shutter image capture operation (blocks 201 to 220) and a rolling shutter readout operation (blocks 230-250). Referring to the upper portion of FIG. 3, the global shutter operation of the method begins by setting the bulk substrate potential $V_{SUB}$ to higher global reset voltage $V_{GRST}$ (block 201), then switching the bulk substrate potential $V_{SUB}$ to the lower integration voltage $V_{INT}$ (block 205), followed by an integration phase (block 210) during which all of pixels of image sensor 100A are controlled such that the photodiodes of every pixel simultaneously capture a corresponding charge, and then a subsequent transfer phase (block 220) in which all of the pixels are controlled, also using the global signals generated by row control circuit 130, such that the captured charges are simultaneously transferred from the photodiode to the memory node in each pixel. Referring to the lower portion of FIG. 3, after each global shutter readout operation is completed, as indicated by the dashed-line arrow extending from below block 220 to block 201, the bulk substrate potential $V_{SUB}$ is switched to higher global reset voltage $V_{GRST}$ to facilitate the beginning of a subsequent integration phase. The rolling shutter readout operation is then performed (blocks 230 and 240) on one row of pixel groups at a time using rolling shutter control signals generated by row control circuit 130 that are repeated for each row until captured charges stored on the memory nodes are read from every row. For example, with reference to FIG. 2(A), the readout operation is performed by selecting (addressing) the uppermost row (e.g., the horizontal row including pixel 110A-10,0 in FIG. 2(A)), then selecting the second row, etc., until captured charges are read from every pixel row of image sensor 100A. During each row readout operation, all pixels in the selected row are controlled using rolling shutter control signals transmitted only to that row (i.e., these control signals are only sent to the pixels in the selected row currently being read). In the generalized method embodiment of FIG. 2(A), the rolling shutter readout operation includes (block 230) resetting the floating diffusion and transmitting SHR values (generated by the potential stored on the reset floating diffusion) onto shared output (column) signal lines from each pixel of the selected row, then (block 240) transferring captured charges from the memory node to the floating diffusion in each pixel of the selected row, and then transmitting SHS values (generated by the captured charge transferred to the floating diffusion) from each pixel of the selected row onto the shared output (column) signal lines 109. As indicated by block 250 in FIG. 3, once the readout process is completed for the current selected row (e.g., the uppermost row in FIG. 2(A)), the reset/SHR read/transfer captured charge/SHS read sequence is repeated by transmitting rolling shutter control signals only to the pixels of the next sequential row of array 105, whereby multiple CDS readout operations are performed during which a SHR and SHS values are transmitted onto associated output signal lines 109. This process is then repeated for each row of pixels until all of the captured charges from every pixel of image sensor 100A have been read out.

Figure 4:
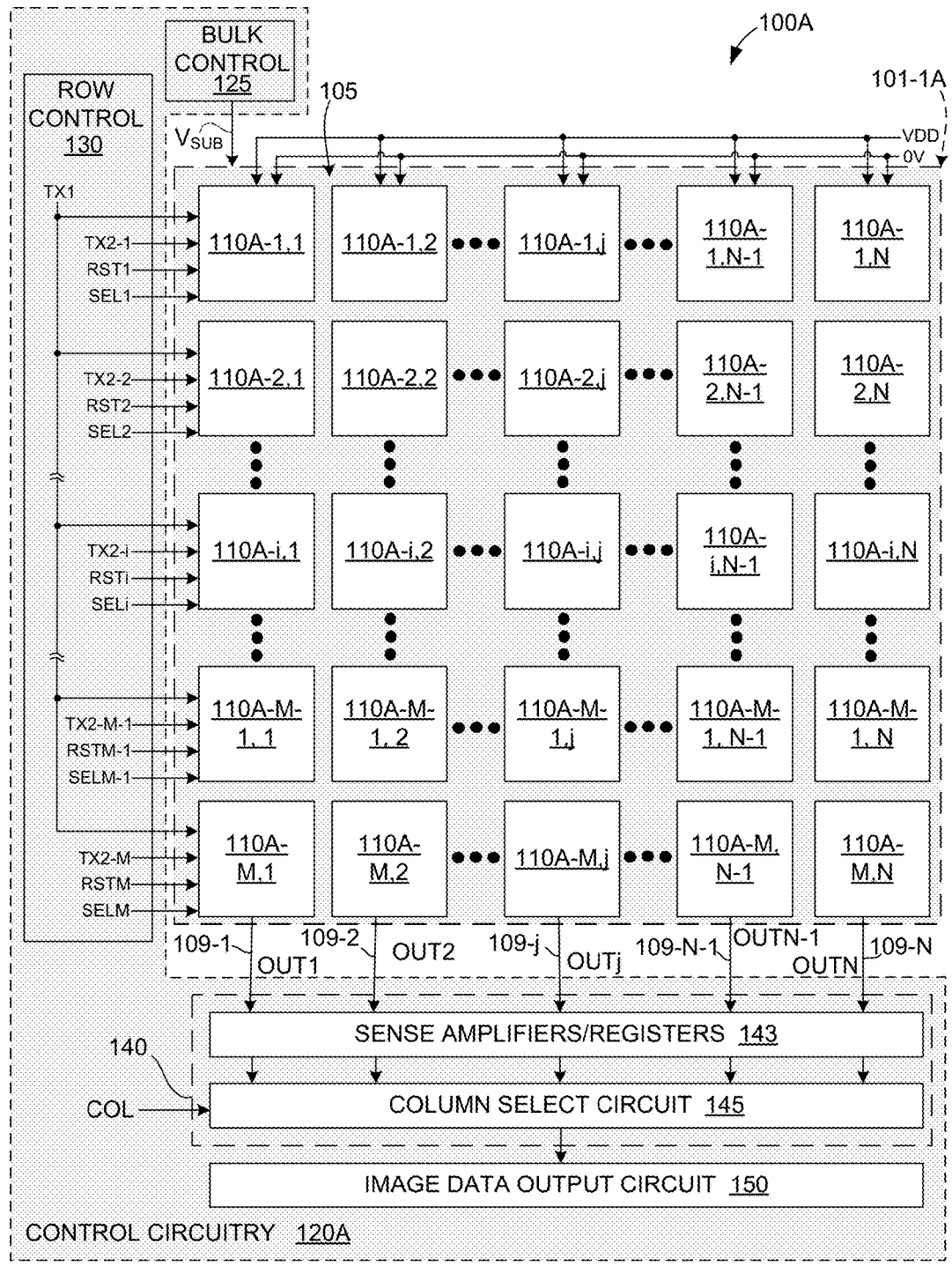
FIG. 4 is a block diagram showing the GS CMOS image sensor of FIG. 2(A) in additional detail.

FIG. 4 is a block diagram showing portions of image sensor 100 in additional detail, wherein pixels 110A-1,1 to 110A-M,N of array 105 are depicted as blocks arranged in an array of horizontal rows and vertical columns, and control circuitry 120A is disposed along a peripheral edge of the array. As set forth above, each pixel 110A-1,1 to 110A-M,N includes circuitry consistent to that of 5T pixel 110A shown in FIGS. 2(A) and 2(B). In accordance with an aspect of the present invention, control circuit 120A includes a bulk control circuit 125 that is configured to generate bulk substrate potential $V_{SUB}$ on switch bulk substrate 101-1A such that it switches between the global reset voltage level $V_{GRST}$ and the integration voltage level $V_{INT}$. Additional global control signal TX1 is generated by control circuit 120A is passed to each pixel row in array 105, and a row control circuit 130 generates three unique rolling shutter (RS) control signals that are transmitted to each row of array 105 (e.g., the uppermost row including pixels 110A-1,1 to 110A-1,N receives RS control signals TX2-1, RST1 and SEL1, the second row including pixels 110A-2,1 to 110A-2,N receives RS control signals TX2-2, RST2 and SEL2, etc.). As indicated at the top of the array, two system voltages VDD and 0V are supplied to array 105 during operation. Similar to conventional image sensors, output values OUT1 to OUTN are generated on corresponding column lines 109-1 to 109-N and read by image data output circuit 140 during the RS readout operation. As indicated at the bottom of FIG. 4, image data output circuit 140 generally includes sense amplifier/registers 143 that detect the output signals (image values) utilizing known techniques, and a column select circuit that sequentially transmits the detected image values from the series of sense amplifiers/registers to image data output circuit 150 for storage and transmission to a memory device (not shown). When arranged correctly (i.e., when the pixels are formed with a minimum of internal routing disposed in the interconnect layer between the silicon surface and the M1 metallization layer), the optical openings above the pixels are not compromised by the inter-pixel signal line routing. Similar to conventional image sensors, pixel group output signals OUT1 to OUTN are transmitted along vertical readout signal lines to sense amplifiers/registers circuit 143 for detection.

Figure 5:
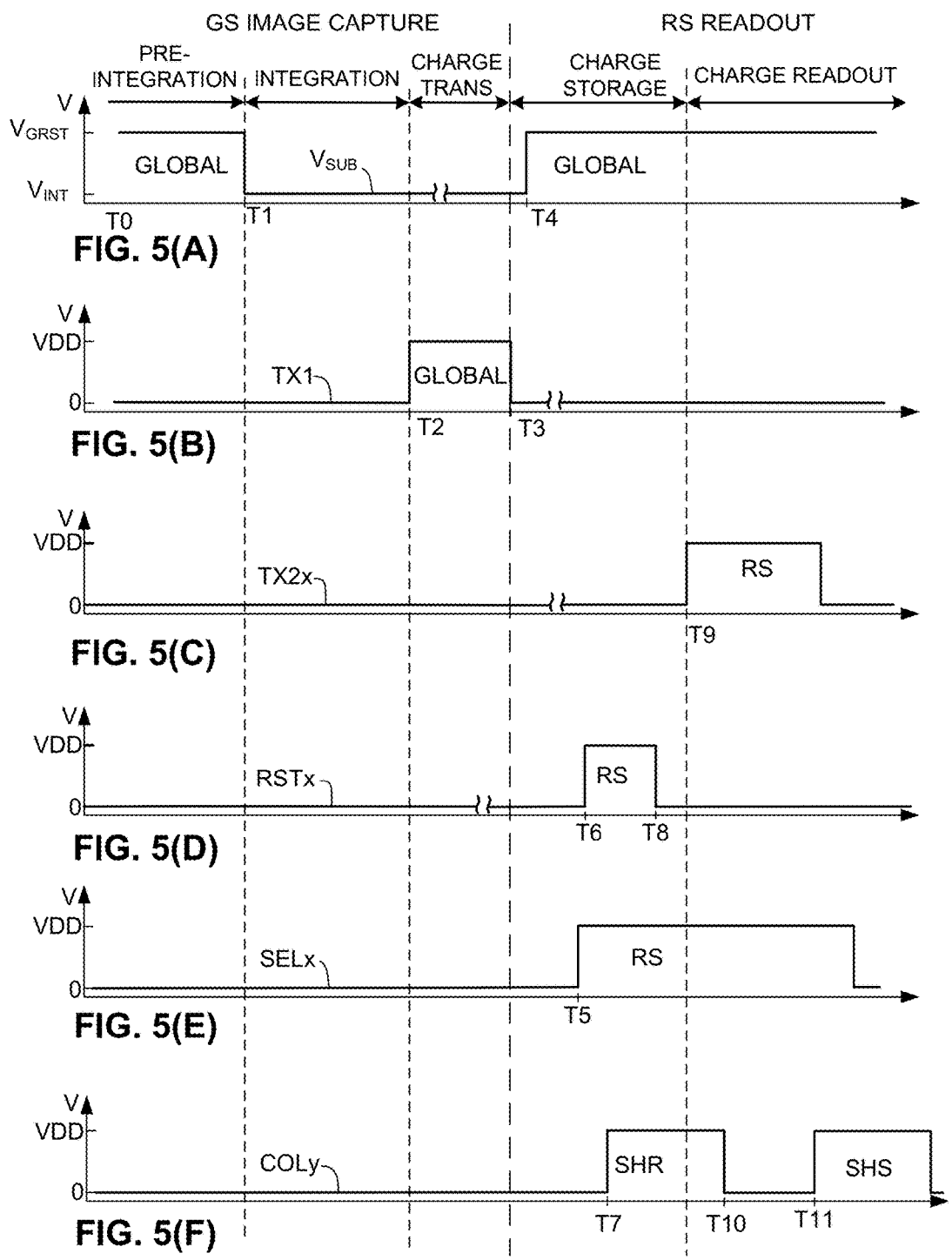
FIGS. 5(A), 5(B), 5(C), 5(D), 5(E) and 5(F) are timing diagrams showing signal levels during operation of the GS pixel of FIG. 2(A) according to an exemplary embodiment of the present invention.

Control circuit 120A is configured using known techniques to cause image sensor 100A to perform the exemplary image capture/readout operation described below with reference to the simplified timing diagrams shown in FIGS. 5(A) to 5(F). FIGS. 5(A) to 5(E) respectively depict bulk substrate potential $V_{SUB}$, control signal TX1, control signal TX2x, control signal RSTx and control signals SELx and COLy, which are respectively applied to bulk substrate 101-1A and transistors Q5, Q6, Q1, Q4 of each pixel 110A of image sensor 100A (see FIG. 2(A)). FIG. 5(F) depicts control signal COLy that controls column select circuit 145 (see FIG. 4). As indicated in row control circuit 130 of FIG. 4 and by the word "GLOBAL" in FIGS. 5(A) and 5(B), bulk substrate potential $V_{SUB}$ and transfer gate control signal TX1 are simultaneously applied/transmitted to every row of array 105. As indicated in row control circuit 130 of FIG. 4 and by "RS" (rolling shutter) in FIGS. 5(C), 5(D) and 5(E), transfer gate signal TX2x, reset control signal RSTx and select control signal SELx are separately generated for each pixel row of array 105. For the sake of clarity, the timing diagrams associated with the rolling shutter readout operation are simplified to illustrate exemplary operations associated with one row and one column. That is, the "x" in TS2x, RSTx and SELx indicates that the depicted RS control signals are generated for only one selected pixel row, and it is understood these signals are sequentially generated for each pixel row during the RS readout operation. Similarly, the "y" in COLy indicates that the depicted signal is associated with readout from a single column (i.e., FIG. 5(F) only illustrates SHR and SHS readout operations for a single column), and that the signal is sequentially generated to read output values from each column using known techniques.

As indicated above FIG. 5(A), the exemplary image capture/readout operation is generally divided into a GS image capture operation and an RS readout operation, where the GS image capture operation is further divided to include a pre-integration phase, an integration phase and a charge transfer phase, and the RS readout operation is generally divided into a charge storage phase and a charge readout phase.

Referring to FIG. 5(A) and to FIG. 4, the global shutter image capture operation begins with the pre-integration phase during which bulk control circuit 125 generates bulk substrate potential $V_{SUB}$ at global reset voltage level $V_{GRST}$ between time T0 and time T1 (all other signals are deasserted). Referring to FIG. 2(A), raising bulk substrate potential $V_{SUB}$ to global reset voltage level $V_{GRST}$ causes effective diodes 101-3D in every pixel 110A to turn on, thereby coupling every photodiode P-A to system voltage VDD such that any charge stored on photodiode P-A of every pixel 110A, which generates an associated potential at photodiode node PD, is simultaneously reset to an initial photodiode charge at the beginning of the GS image capture operation. All other transistors of pixel group 100A remain off during this period.

Referring to FIG. 5(B) and to FIG. 4, the integration phase begins at time T1 when bulk (first) control circuit portion 125 switches bulk substrate potential $V_{SUB}$ to integration voltage level $V_{INT}$, thereby turning off effective diodes 101-3D in every pixel 110A to isolate the photodiodes in every pixel 110A, whereby photodiode P-A in each pixel 110A is simultaneously controlled to generate a captured charge in accordance with an amount of light received by that pixel during the integration (first) phase of the global shutter image capture operation. Charge in the form of electrons is allowed to accumulate on each photodiode P-A for a set amount of time (e.g., determined by a user or control circuit 120A) which ends at time T2, when transfer gate control signal TX1 is asserted.

Referring to FIG. 5(B) and to FIG. 4, control circuit 120A executes the charge transfer (second) phase of GS image capture by causing a second portion of control circuit 120A (e.g., row control circuit 130) to assert transfer gate control signal TX1 at time T2, and utilizes associated signal lines to simultaneously transmit (first) transfer gate control signal TX1 to (first) transfer gate transistor Q5 in every pixel 110A, thereby simultaneously transferring the charge (image data) captured by each photodiode P-A during the integration phase to its associated memory node MN-A in every pixel 110A of array 105. Additional detail regarding how the two-part MN-A structure facilitates transfer of each captured charge from the photodiode to the memory node diode portion is described below with reference to FIG. 10. The charge transfer phase (and the GS image capture operation) ends at time T3 when transfer gate control signal TX1 is de-asserted to simultaneously turn off transfer gate transistor Q5 in every pixel 110A. In one embodiment, bulk substrate potential $V_{SUB}$ is maintained at lower integration voltage level $V_{INT}$ (e.g., 0.1V to 0.5V lower) than transfer gate control signal TX1 during the period between time T3 and time T4 to stimulate "anti-blooming".

Referring to FIG. 5(B), control circuit 120A starts the charge storage phase of the RS readout operation by deasserting transfer gate control signal TX1 at time T3, thereby preventing further electron flow from the photodiode to the memory node in each pixel. As indicated in FIG. 5(A), at time T4 bulk substrate potential $V_{SUB}$ is again raised to global reset voltage level $V_{GRST}$, thereby again depleting charge (electrons) from the photodiode of every pixel. As described in additional detail below with reference to FIG. 11, during the storage phase electrons are prevented from flowing back to photodiode by way of the lower potential profile of the memory node buried layer portion. Note that the charge storage phase for a given pixel continues until the row in which the pixel is selected for readout, and the associated transfer gate control signal TX2x for the pixel's row is asserted in the manner described below.

The control circuit next utilizes a third circuit portion (e.g., portions of row control circuit 130 and column control/readout circuit 140) to perform the RS readout operation. According to the preferred embodiment, the RS readout operation involves Correlated Double Sampling (CDS) readout in which a Sample and Hold Reset (SHR) charge level is read out from each pixel of the selected row during a first readout phase, and then a Sample and Hold image (SHS) charge level is read out from each pixel of the selected row, and then the CDS readout process is performed on a next-sequential selected pixel row. Referring to FIGS. 5(E), 5(D) and 5(F), the control circuit utilizes portions of row control circuit 130 to generate and transmit SHR control signals (i.e., RSTx and SELx) and SHS control signals (i.e., TX2x and SELx) to each pixel of the selected row such that only the pixels of the selected row receive the SHR and SHS control signals during a corresponding row-select time period, which is determined by the assertion of the row select control signal SELx for the selected row. That is, during the first (SHR) phase, row control circuit 130 asserts row select control signal SELx at time T5 and reset control signals RSTx at time T6, whereby floating diffusion FD-A of each pixel 110A in the selected row stores a reset charge having a reset (first) voltage level equal to VDD that turns on sample-hold transistor Q3, thereby transmitting the reset level onto an associated column line in response to said SHR control signals. Column control/readout circuit 140 asserts column select signals COLy starting at time T7 to sequentially read the SHR levels from each column line. At time T8, row control circuit 130 de-asserts reset control signals RSTx to end the first (SHR) readout phase. During the second (SHS) phase, row control circuit 130 asserts transfer gate control signal TX2x at time T9, whereby the captured charge stored in memory node MN-A is transferred to floating diffusion FD in each pixel 110A of the selected pixel, causing these floating diffusions to store image (second) voltage levels determined by the amount of stored charge, whereby sample-hold transistor Q3 is turned on by a corresponding amount proportional to the captured charge, thereby transmitting the captured charge (SHS level) onto an associated column line in response to said SHS control signals. Column control/readout circuit 140 asserts column select signals COLy starting at time T11 to sequentially read the SHS levels from each column line.

Referring to FIG. 5(B), according to a feature of array 100A that is made possible by the use of buried channel region MNBC-A, the (first) transfer gate transistor Q5 of each pixel 110A is controllable using only two voltage levels (i.e., transfer gate control signal TX1 is either VDD or 0V). This is a very attractive feature because it avoids the need for a third "store" control voltage and associated three-level drivers, which are needed in pixel arrangements that require charge storage under the transfer gate, thus simplifying the control circuit and reducing overall costs.

Figure 6:
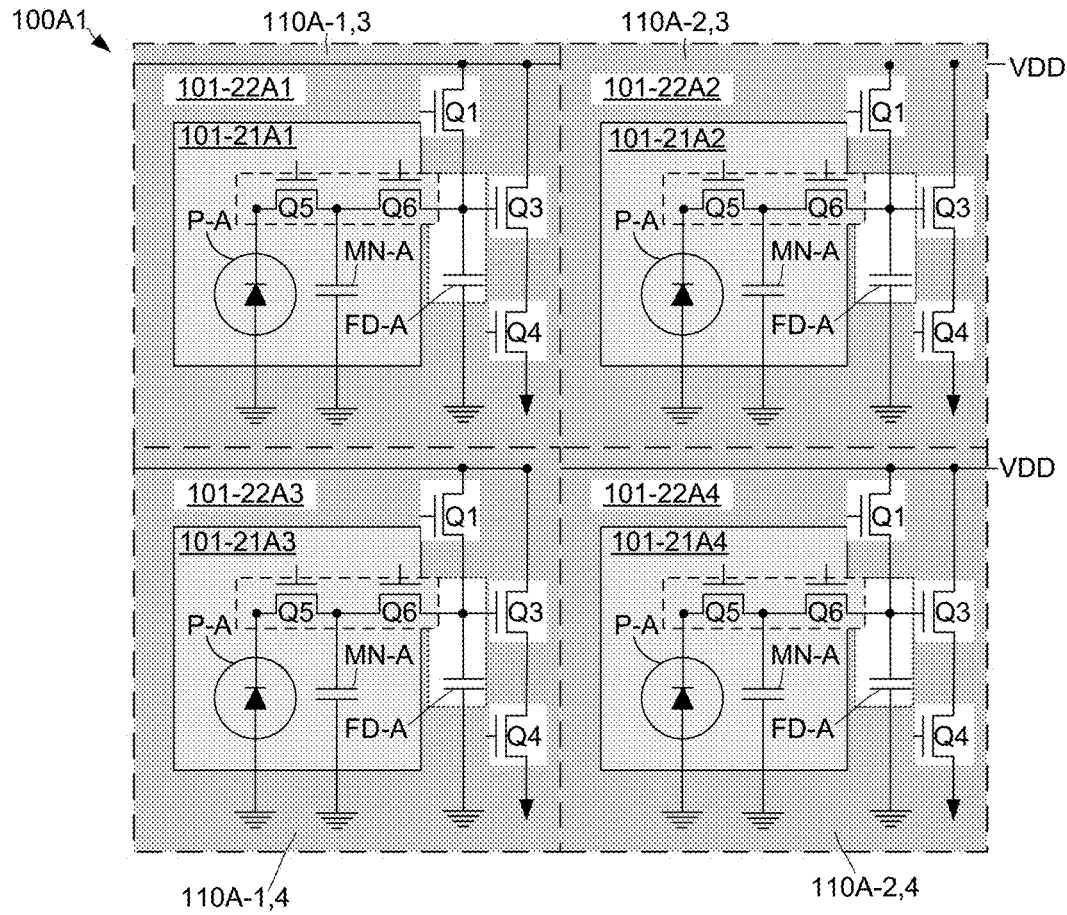
FIG. 6 is a hybrid top-plan/schematic diagram depicting a partial pixel array of the GS image sensor of FIG. 2(A) according to another embodiment of the present invention.

FIG. 6 is a hybrid top-plan/schematic depicting an exemplary layout of a portion of a GS image sensor 100A1, which includes four pixels 110A-1,3, 110A-2,3, 110A-1,4 and 110A-2,4 that are configured substantially identically to those described above with reference to FIGS. 2(A) and 2(B). Specifically, each pixel 110A-1,3, 110A-2,3, 110A-1,4 and 110A-2,4 includes a photodiode P-A, memory node MN-A and intervening transfer gate Q5 formed in/over a designated n-type region, and a floating diffusion FD-A and transfer gate Q6 formed over a corresponding p-doped sinker implant region that surrounds the pixel's designated n-type region. GS image sensor 100A1 differs from the embodiments described above in that the additional circuitry associated with each pixel is also formed on the pixel's corresponding p-doped sinker implant region. For example, photodiode P-A, memory node MN-A and transfer gate Q5 of pixel 110A-1,3 are formed in/over designated n-type region 101-21A1, and floating diffusion FD-A, transfer gate Q6, reset gate Q1 and source-follower transistor Q3 and row-select transistor Q4 are formed over portions of corresponding p-doped sinker implant region 101-22A1, which entirely surrounds designated n-type region 101-21A1. Similarly, pixel 110A-1,4 is formed in/over designated n-type region 101-21A2 and corresponding p-doped sinker implant region 101-22A2, pixel 110A-2,3 is formed in/over designated n-type region 101-21A3 and corresponding p-doped sinker implant region 101-22A3, and pixel 110A-2,4 is formed in/over designated n-type region 101-21A4 and corresponding p-doped sinker implant region 101-22A4. As depicted in FIG. 6, p-doped sinker implant regions 101-22A1 to 101-22A4 are contiguous (e.g., sinker implant region 101-22A1 abuts sinker regions 101-22A2 and 101-22A3). In an alternative embodiment pixels 110A-1,3, 110A-2,3, 110A-1,4 and 110A-2,4 may be disposed in a space-apart relationship such that sinker implant region 101-22A1 is separated from sinker regions 101-22A2 and 101-22A3 by a region of n-epi material.

Figure 7:
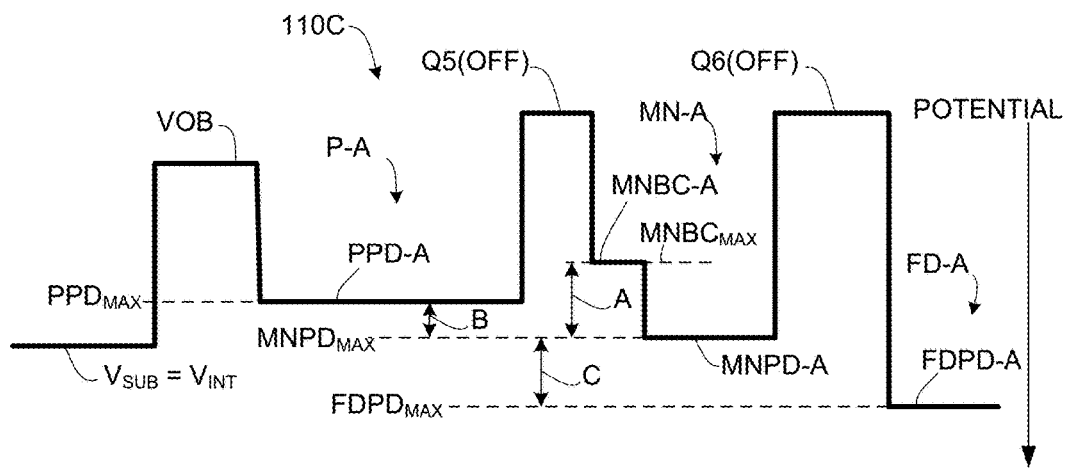
FIG. 7 is a potential diagram showing relative exemplary charges stored on the GS pixel of FIG. 6 when the bulk substrate is at a low voltage level.

FIG. 7 shows a potential diagram indicating potential wells of pixel 110A (described above with reference to FIG. 2(A)) during operation. In particular, FIG. 7 shows relative maximum potentials of photodiode diode portion PPD-A of photodiode P-A, buried channel portion MNBC-A and memory node diode portion MNPD-A of memory node MN-A, and floating diffusion diode portion FDPD-A of floating diffusion FD-A. In FIG. 7, transfer gates Q5 and Q6 are depicted in a turned off state and substrate voltage $V_{SUB}$ is set at the lower integration voltage level $V_{INT}$, whereby vertical barrier implant 101-3A (see FIG. 2(B)) generates a vertical overflow (potential) barrier VOB between the constant high potential well region formed by n-type bulk substrate 101-1A (see FIG. 2(B)) and the relatively small potential photodiode PPD-A (i.e., diode 101-3D, shown in FIG. 2(B)), is effectively turned off). As understood by those in the art, the size and composition of photodiode P-A determines its maximum potential PPD, which is indicated in FIG. 7. Similarly, the size and composition of memory node diode portion MNPD-A and floating diffusion diode portion FDPD-A determine maximum charge potentials $MNPD_{MAX}$ and $FDPD_{MAX}$, which are also indicated in FIG. 7.

As indicated in FIG. 7 and set forth above, memory node diode portion MNPD-A has a doping level that is greater than the doping level of buried channel portion MNBC-A. As such, maximum charge potential $MNPD_{MAX}$ is shown as being greater than a maximum charge potential $MNBC_{MAX}$ of buried channel portion MNBC-A (i.e., as indicated by arrow A), which generates the intrinsic lateral electrical field discussed above. That is, when transfer gate transistor Q5 is pulsed high (off, e.g., as indicated in FIGS. 7-9 and 11), the lateral field prevents electrons from passing between undoped side of transfer gate transistor Q5 and the doped side of transfer gate transistor Q5. When transfer gate transistor Q5 is pulsed low (on, e.g., as shown in FIG. 10), the lateral field causes electrons to flow from the undoped side of transfer gate transistor Q5 to the pinned MN-A side.

According to another embodiment of the present invention, diode portion PPD-A of photodiode P-A, memory node diode portion MNPD-A of memory node MN-A, and floating diffusion diode portion FDPD-A of floating diffusion FD-A are fabricated with doping profiles configured to generate relative maximum charge potentials that progressively increase. Specifically, diode portion PPD-A has a first doping profile configured to generate (first) maximum charge potential $PPD_{MAX}$, and diode portion MNPD-A of memory node MN-A has a doping profile configured to generate a (second) maximum charge potential $MNPD_{MAX}$ that is slightly greater (e.g., in the range of 0.1V to 0.5V) than maximum charge potential PPD, as indicated by arrow B in FIG. 7. Similarly, (third) diode portion FDPD-A of floating diffusion FD-A has a (third) doping profile configured to generate a (third) maximum charge potential $FDPD_{MAX}$ that is greater than the second maximum charge potential $MNPD_{MAX}$, as indicated by arrow C in FIG. 7. The benefit of this potential well arrangement is fast transfer of electrons in the direction of floating diffusion FD-A. Compared with the prior art designs that do not employ the suggested lateral fields, this facilitates the use of decreased operating voltages, and thus suppress parasitic discharge of memory node MN-A and floating diffusion FD-A during the sensor read-out.

FIGS. 8-11 are potential diagrams depicting pixel 110A during various operation phases mentioned above.

Figure 8:
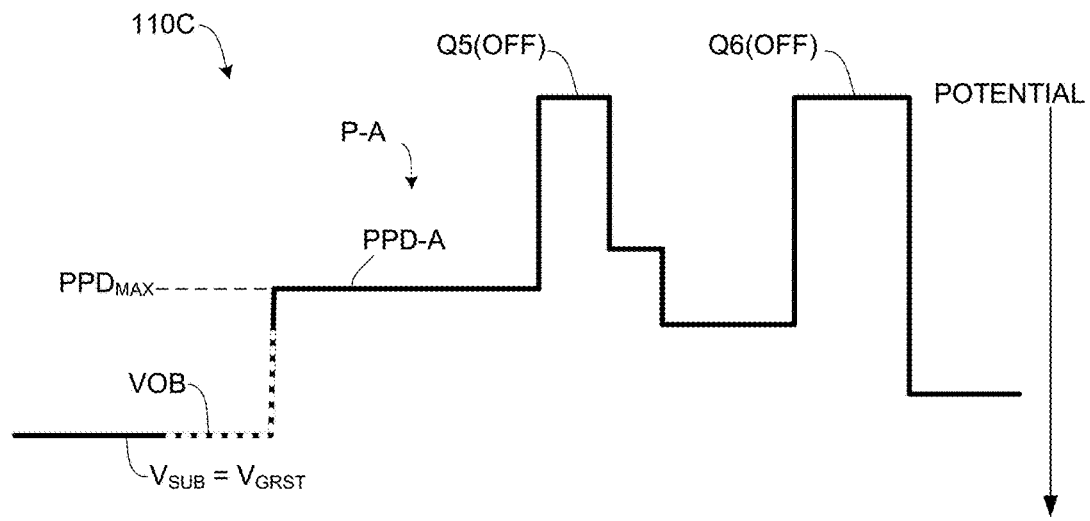
FIG. 8 is a simplified potential diagram showing exemplary pixel charges stored on the GS pixel of FIG. 6 during a global reset operating phase.

FIG. 8 shows a potential diagram of pixel 110A during a global reset operating phase (i.e., before the start of the integration phase described above). During this operating state, both transfer gates Q5 and Q6 are turned off, and bulk substrate potential $V_{SUB}$ is switched high (i.e., raised to global reset voltage level $V_{GRST}$), thereby suppressing the vertical overflow barrier VOB such that diode portion PPD-A of photodiode P-A is initialized to a reset voltage level (i.e., PPD).

Figure 9:
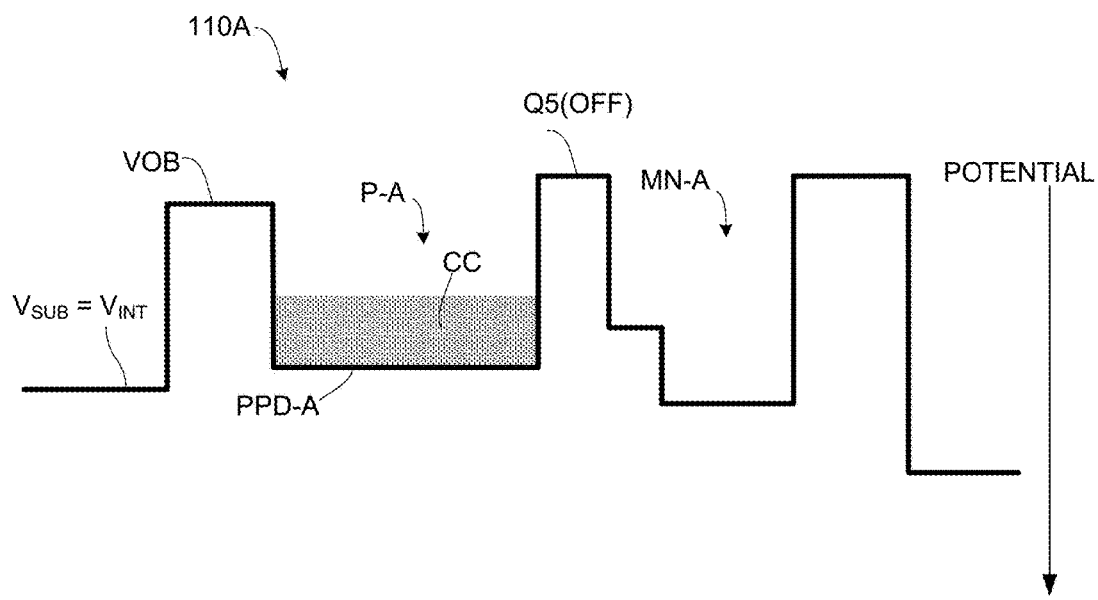
FIG. 9 is a simplified potential diagram showing exemplary pixel charges stored on the GS pixel of FIG. 5 during an integration operating phase.
Figure 10:
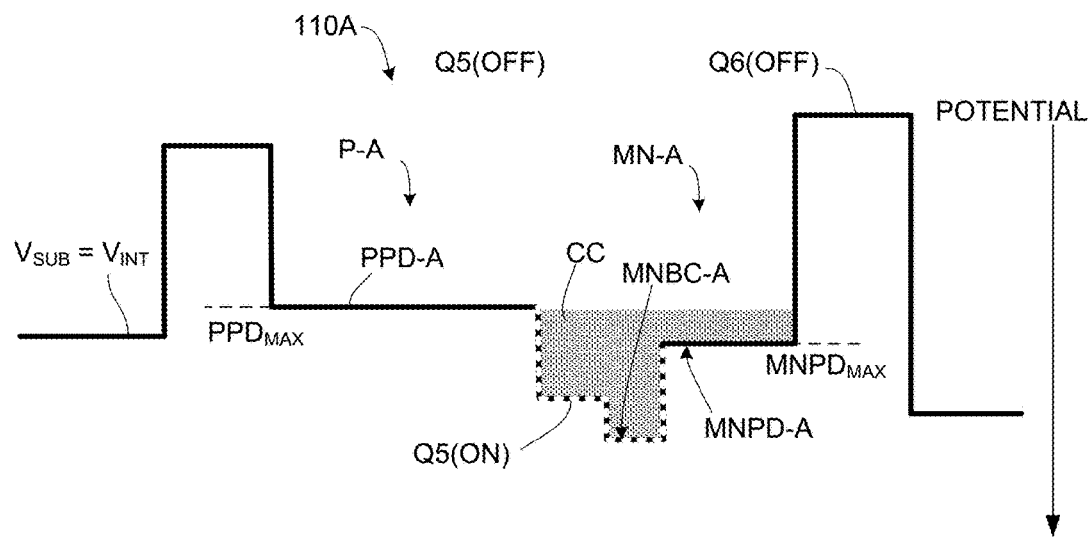
FIG. 10 is a simplified potential diagram showing exemplary pixel charges stored on the GS pixel of FIG. 5 during transfer of a captured charge to the memory node.

FIG. 9 shows a potential diagram of pixel 110A during the subsequent integration phase. Bulk substrate potential $V_{SUB}$ is again switched low ($V_{SUB}=V_{INT}$), thereby re-establishing the vertical overflow barrier VOB between photodiode P-A and the bulk substrate, and transistor Q5 remains turned off, which maintains the barrier between photodiode P-A and memory node MN-A. As indicated by the shaded block in FIG. 9, with photodiode P-A now decoupled (floating), photoelectrons begin to collect in the potential well formed by diode portion PPD-A, thereby generating a captured charge CC. Note that the depicted amount of captured charge CC is arbitrarily selected for descriptive purposes. As understood by those skilled in the art, the actual amount of captured charge CC during a given integration phase is determined by the amount of light received by pixel 110A during the given integration phase.

FIG. 10 shows a potential diagram of pixel 110A during the subsequent charge transfer phase, when transfer gate transistor Q5 is turned on (i.e., transfer gate control signal TX1 discussed above is asserted) such that the potential of transistor Q5 is increased above maximum potential MNPD-$_{MAX}$ of diode portion MNPD-A. Note that turning on transistor Q5 also increases the potential of buried channel portion MNBC-A above maximum potential MNPD$_{MAX}$ of diode portion MNPD-A. In a preferred embodiment, when substrate voltage $V_{SUB}$ is maintained at lower voltage level $V_{INT}$, substrate voltage $V_{SUB}$ is maintained at a potential that is lower than the control (ON) voltage applied to transfer gate Q5. By removing the barrier between photodiode P-A and memory node MN-A in this manner, the electrons forming captured charge CC are caused to flow from the lower maximum potential PPD of photodiode P-A toward the higher maximum potentials MNPD of memory node diode portion MNPD-A and the temporarily increased potential of memory node buried channel portion MNBC-A, whereby the entire captured charge is transferred out of photodiode P-A. Note that electrons cannot spill back to photodiode P-A from memory node buried channel MNBC-A until the potential in buried channel MNBC-A is again made lower than maximum potential PPD$_{MAX}$.

Figure 11:
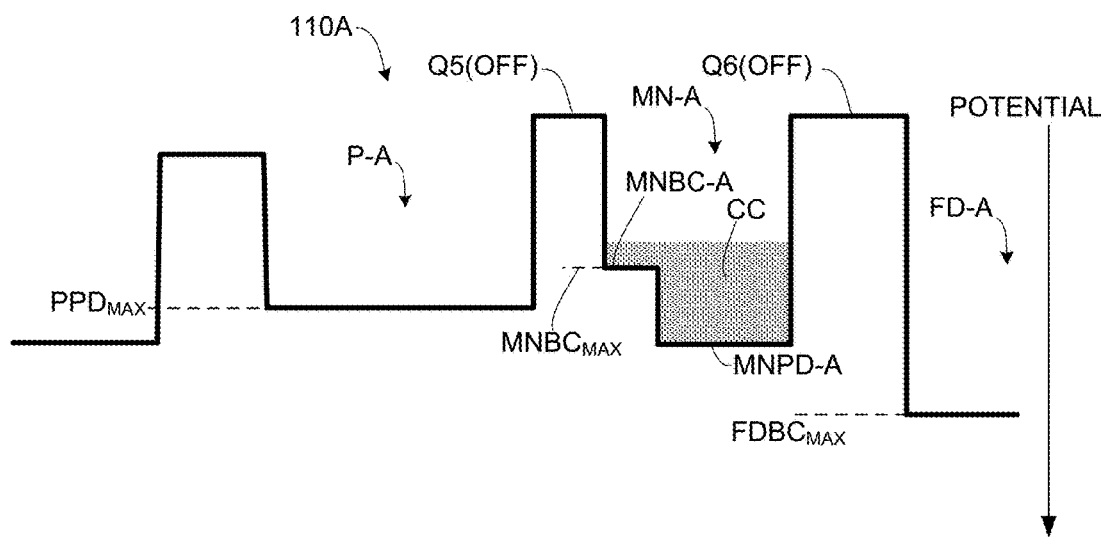
FIG. 11 is a simplified potential diagram showing exemplary pixel charges stored on the GS pixel of FIG. 5 during storage of a captured charge in the memory node.

FIG. 11 shows a potential diagram of pixel 110A during the subsequent storage phase during which captured charge CC is stored in memory node MN-A. Transfer gate Q5 is turned off at the end of the charge transfer operation, thereby re-establishing the associated barrier between photodiode P-A and memory node MN-A, and causes the potential of memory node buried channel portion MNBC-A to return to its initial maximum potential value MNBC$_{MAX}$. When transfer gate Q5 is turned off, substantially all remaining electrons under transfer gate Q5 flows into memory node MN-A due to the intrinsic lateral electrical field. That is, captured charge CC is stored in two physical locations: in buried channel MNBC-A, which is located below transfer gate transistor Q5, and in diode portion MNPD-A, which is the pinned diode disposed in the gap between transfer gates Q5 and Q6. The barriers generated by turned-off transistors Q5 and Q6 prevent leakage of captured charge CC from memory node MN-A either into photodiode P-A or floating diffusion FD-A. Note that p-type diffusion 106-1 (see FIG. 2(B)) also prevent electron flow from memory node MN-A into photodiode P-A. The methodology for subsequently transferring captured charge CC from memory node MN-A to floating diffusion FD-A is similar to the photodiode P-A to memory node MN-A charge transfer operation described above, and thus is not described in detail here.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described with reference to 5T GS CMOS image sensors, the various features and aspects of the present invention may be beneficially utilized in other types of image sensors, or in GS CMOS image sensors having pixels including a different number (e.g., more than five) transistors.

The invention claimed is:

1. An image sensor comprising:
a substrate including a p-type vertical barrier implant sandwiched between an n-doped bulk substrate and an n-doped region; and
a pixel including a n-type photodiode and an n-type memory node diffused into said n-doped region in a space-apart relationship, said pixel also including a first transfer gate disposed over an upper surface of said substrate and operably positioned to transfer charges from the photodiode to the memory node in response to a first control signal,
wherein the p-type vertical barrier implant is configured to form a potential barrier between said n-doped region and said bulk substrate,
wherein the pixel further includes a first buried channel portion disposed under the first transfer gate and having a first n-type doping level, and a first diode portion and having a second n-type doping level that is greater than the first n-type doping level, and
wherein the image sensor further comprises a control circuit configured to apply a reset control voltage onto the bulk substrate such that electrons stored on the photodiode are transmitted through the p-type vertical barrier implant to the bulk substrate, thereby resetting said photodiode to an initial photodiode charge before an image capture operation, and configured to subsequently apply an integration control voltage onto the bulk substrate such that electrons collect in the photodiode during an image capture operation in accordance with an amount of light received by said each pixel during the image capture operation.

2. An image sensor comprising:
a substrate including a p-type vertical barrier implant sandwiched between an n-doped bulk substrate and an n-doped region; and
a pixel including a n-type photodiode and an n-type memory node diffused into said n-doped region in a space-apart relationship, said pixel also including a first transfer gate disposed over an upper surface of said substrate and operably positioned to transfer charges from the photodiode to the memory node in response to a first control signal,
wherein the p-type vertical barrier implant is configured to form a potential barrier between said n-doped region and said bulk substrate,
wherein the pixel further includes a first buried channel portion disposed under the first transfer gate and having a first n-type doping level, and a first diode portion and having a second n-type doping level that is greater than the first n-type doping level,
wherein the substrate comprises an n-doped epitaxial layer formed on said bulk substrate, and
wherein the n-doped region and the p-type vertical barrier implant are formed in the n-doped epitaxial layer.

3. The image sensor of claim 2, wherein each pixel further comprises a p-type sinker implant including a p-type dopant diffused into a portion of said n-doped epitaxial layer that extends between an upper surface of said n-doped epitaxial layer and said p-type vertical barrier implant such that said p-type sinker implant abuts a side edge boundary of said n-type photodiode.

4. The image sensor of claim 2, wherein each pixel further comprises a plurality of contiguous p-type sinker implant sections that are disposed in the n-doped epitaxial layer and collectively surround the n-doped region of said each pixel and extend between an upper surface of said n-doped epitaxial layer and said p-type vertical barrier implant such that said plurality of contiguous p-type sinker implant sections and a corresponding portion of said p-type vertical barrier implant form a box-shaped p-doped diffusion that entirely separates the n-doped region of said each pixel from n-doped regions of adjacent said pixels.

5. An image sensor comprising:
a substrate including a p-type vertical barrier implant sandwiched between an n-doped bulk substrate and an n-doped region; and
a pixel including a n-type photodiode and an n-type memory node diffused into said n-doped region in a space-apart relationship, said pixel also including a first transfer gate disposed over an upper surface of said substrate and operably positioned to transfer charges from the photodiode to the memory node in response to a first control signal,
wherein the p-type vertical barrier implant is configured to form a potential barrier between said n-doped region and said bulk substrate,
wherein the pixel further includes a first buried channel portion disposed under the first transfer gate and having a first n-type doping level, and a first diode portion and having a second n-type doping level that is greater than the first n-type doping level,
wherein the first buried channel portion and the first diode portion comprise n-type dopants, and
wherein each pixel further comprises:
a first p-type diffusion disposed under the first buried channel portion and the first diode portion of the memory node, and
a second p-type diffusion disposed between the first buried channel portion and the first diode portion of the memory node and an upper surface of the substrate, wherein said second p-type diffusion extends between said memory node and said photodiode.

6. The image sensor of claim 5, wherein each pixel further comprises:
a floating diffusion disposed in a p-type sinker implant section formed in the substrate adjacent to the n-doped region; and
a second transfer gate disposed over said upper surface of said substrate and operably positioned to transfer charges from the memory node to the floating diffusion in response to a second control signal.

7. The image sensor of claim 6, wherein the floating diffusion of each said pixel further comprises a second buried channel portion disposed under the second transfer gate and having a third doping level, and a second diode portion having a fourth doping level that is greater than the third doping level such that a second intrinsic lateral electrical field is generated that drives electrons from the second buried channel portion into the second diode portion.

8. The image sensor of claim 5, wherein each pixel further comprises a light shield disposed over the floating diffusion, the second transfer gate, the memory node, and at least a portion of the first transfer gate.

9. The image sensor according to claim 5,
wherein each said pixel further comprises:
a reset transistor connected between a voltage source and said floating diffusion and having a gate terminal operably coupled to receive a reset control signal;
a source-follower transistor having a gate terminal connected to said floating diffusion; and
a row-select transistor connected between said source-follower transistor and a readout signal line, a gate terminal of said row-select transistor being connected to receive a row select control signal.

10. The image sensor according to claim 9,
wherein the plurality of pixels are disposed in an array including a plurality of rows and a plurality of columns, and
wherein the global shutter image sensor further comprises a control circuit including:
a first circuit portion configured to transmit a global reset voltage level to the bulk substrate such that a charge stored on the photodiode of all of the pixels of the pixel array is simultaneously reset to an initial photodiode charge at the beginning of a global shutter image capture operation, and then to transmit an integration voltage level to the bulk substrate such that the photodiode of each said pixel is controlled to generate a captured charge in accordance with an amount of light received by said each pixel during a first phase of the global shutter image capture operation;
a second circuit portion configured to transmit a first transfer gate control signal to the first transfer gate transistor in all of the plurality of pixels such that, in each said pixel, said captured charge is transferred from said photodiode to said memory node during a second phase of the global shutter image capture operation;
a third circuit portion configured to transmit SHR control signals and SHS control signals to said plurality pixels and to read out image data from said plurality of pixels during a rolling shutter readout operation such that only the pixels of a selected row of pixels receive said SHR and SHS control signals during a corresponding row-select time period of said rolling shutter readout operation,
wherein the third circuit portion is configured such that each said pixel of said selected row is controlled such that said floating diffusion of each said pixel stores a reset charge having a first voltage level, and said first voltage level is transmitted onto an associated column line in response to said SHR control signals during a first phase of said corresponding row-select time period, and
wherein the third circuit portion is configured such that each said pixel of said selected row is controlled such that said captured charge is transferred from said memory node to said floating diffusion of each said pixel, and a second voltage level generated by said captured charge is transmitted onto said associated column line in response to said SHS control signals during a second phase of said corresponding row-select time period.

11. The image sensor according to claim 10,
wherein the photodiode and the first diode portion of the memory node comprise pinned diode structures, and
wherein the second circuit portion is further configured such that said first transfer gate control signal transmitted to the first transfer gate transistor in all of the plurality of pixels has only two voltage levels.

12. A global shutter image sensor including a plurality of pixels disposed on an n-type substrate, wherein each pixel comprises:
a photodiode disposed in an n-type region of the substrate;
a memory node disposed in the n-type region of the substrate, the memory node being spaced from the photodiode;
a floating diffusion disposed in p-type region of the substrate;

a first transfer gate connected between the memory node and the photodiode; and a second transfer gate connected between the memory node and the floating diffusion, wherein the memory node includes a first buried channel portion disposed under the first transfer gate and having a first doping level, and a first diode portion and having a second doping level that is greater than the first doping level such that a first intrinsic lateral electrical field is generated that drives electrons from the first buried channel portion into the first diode portion, and wherein the floating diffusion includes a second buried channel portion disposed under the second transfer gate, said second buried channel portion having a third doping level, said floating diffusion also including a second diode portion having a fourth doping level that is greater than the third doping level such that a second intrinsic lateral electrical field is generated that drives electrons from the second buried channel portion into the second diode portion.

13. The global shutter image sensor of claim 12, wherein the photodiode and the first diode portion of the memory node comprise pinned diode structures, wherein the first buried channel portion and the first diode portion comprise n-type dopants, and wherein each pixel further comprises:
 a first p-type diffusion disposed under the first buried channel portion and the first diode portion of the memory node, and
 a second p-type diffusion disposed between the first buried channel portion and the first diode portion of the memory node and an upper surface of the substrate.

14. The global shutter image sensor according to claim 12, wherein the first diode portion of the memory node is configured to have a first maximum potential value, and wherein the second diode portion of the floating diffusion is configured to have a second maximum potential value, wherein the photodiode includes a third diode portion configured to have a first maximum potential value, and wherein the first, second and third diode portions are configured such that the second maximum potential value is greater than the first maximum potential value, and such that the first maximum potential value is greater than the third maximum potential value.

15. The global shutter image sensor of claim 14, wherein the first buried channel portion of the memory node is configured to have a fourth maximum potential value that is lower than the first maximum potential value of the first diode portion.

16. The global shutter image sensor of claim 12, wherein each pixel further comprises a light shield disposed over the floating diffusion, the second transfer gate, the memory node, and at least a portion of the first transfer gate.

17. The global shutter image sensor according to claim 12, wherein each said pixel further comprises:

a reset transistor connected between a voltage source and said floating diffusion and having a gate terminal operably coupled to receive a reset control signal;

a source-follower transistor having a gate terminal connected to said floating diffusion; and a row-select transistor connected between said source-follower transistor and a readout signal line, a gate terminal of said row-select transistor being connected to receive a row select control signal.

18. The global shutter image sensor according to claim 17, wherein the plurality of pixels are disposed in an array including a plurality of rows and a plurality of columns, wherein the n-type substrate includes a p-type vertical barrier implant sandwiched between an n-doped bulk substrate and an epitaxial layer, wherein plurality of pixels are disposed on the epitaxial layer, and wherein the global shutter image sensor further comprises a control circuit including:

a first circuit portion configured to transmit a global reset voltage level to the bulk substrate such that a charge stored on the photodiode of all of the pixels of the pixel array is simultaneously reset to an initial photodiode charge at the beginning of a global shutter image capture operation, and to transmit an integration voltage level to the bulk substrate such that the photodiode of each said pixel is controlled to generate a captured charge in accordance with an amount of light received by said each pixel during a first phase of the global shutter image capture operation;

a second circuit portion configured to transmit a first transfer gate control signal to the first transfer gate transistor in all of the plurality of pixels such that, in each said pixel, said captured charge is transferred from said photodiode to said memory node during a second phase of the global shutter image capture operation;

a third circuit portion configured to transmit SHR control signals and SHS control signals to said plurality pixels and to read out image data from said plurality of pixels during a rolling shutter readout operation such that only the pixels of a selected row of pixels receive said SHR and SHS control signals during a corresponding row-select time period of said rolling shutter readout operation, wherein the third circuit portion is configured such that each said pixel of said selected row is controlled such that said floating diffusion of each said pixel stores a reset charge having a first voltage level, and said first voltage level is transmitted onto an associated column line in response to said SHR control signals during a first phase of said corresponding row-select time period, and wherein the third circuit portion is configured such that each said pixel of said selected row is controlled such that said captured charge is transferred from said memory node to said floating diffusion of each said pixel, and a second voltage level generated by said captured charge is transmitted onto said associated column line in response to said SHS control signals during a second phase of said corresponding row-select time period.

19. The global shutter image sensor according to claim 18, wherein the photodiode comprises a pinned diode structure, and wherein the second circuit portion is further configured such that said first transfer gate control signal transmitted to the first transfer gate transistor in all of the plurality of pixels has only two voltage levels.

\* \* \* \* \*